United States Patent [19]
Maejima et al.

[11] Patent Number: 6,100,201
[45] Date of Patent: Aug. 8, 2000

[54] METHOD OF FORMING A SEMICONDUCTOR MEMORY DEVICE

[75] Inventors: Yukihiko Maejima; Jun Kawahara; Shinobu Saitoh; Yoshihiro Hayashi, all of Tokyo, Japan

[73] Assignee: NEC Corporation, Tokyo, Japan

[21] Appl. No.: 09/033,912

[22] Filed: Mar. 3, 1998

[30] Foreign Application Priority Data

Mar. 5, 1997 [JP] Japan ................................. 9-049526

[51] Int. Cl.[7] ........................ H01L 21/302; H01L 21/461
[52] U.S. Cl. .......................... 438/706; 438/712; 438/715; 438/723
[58] Field of Search ..................... 438/723, 396, 438/712, 713, 397, 706, 707; 216/76

[56] References Cited

U.S. PATENT DOCUMENTS

| | | | |
|---|---|---|---|
| 4,444,618 | 4/1984 | Saia et al. | 438/712 |
| 5,304,514 | 4/1994 | Nishibe et al. | 438/713 |
| 5,396,093 | 3/1995 | Lu | 257/306 |
| 5,443,688 | 8/1995 | Toure et al. | 438/396 |
| 5,449,934 | 9/1995 | Shono et al. | 257/295 |
| 5,518,962 | 5/1996 | Murao | 438/624 |
| 5,638,319 | 6/1997 | Onishi et al. | 257/295 |
| 5,776,356 | 7/1998 | Yokoyama | 216/76 |
| 5,851,841 | 12/1998 | Ushikubo et al. | 438/240 |
| 5,854,104 | 12/1998 | Onishi et al. | 438/396 |
| 5,854,499 | 12/1998 | Nishioka | 438/240 |

FOREIGN PATENT DOCUMENTS

| | | |
|---|---|---|
| 64-15932 | 1/1989 | Japan . |
| 2-208978 | 8/1990 | Japan . |
| 5-90606 | 4/1993 | Japan . |
| 5-291247 | 11/1993 | Japan . |
| 6-177085 | 6/1994 | Japan . |
| 8-17822 | 1/1996 | Japan . |
| 8-181286 | 7/1996 | Japan . |
| 8-213364 | 8/1996 | Japan . |
| WO 93/12542 | 6/1993 | WIPO . |

Primary Examiner—Felisa Garrett
Assistant Examiner—Duy-Vu Deo
Attorney, Agent, or Firm—Young & Thompson

[57] ABSTRACT

A method of forming a capacitor by forming a dielectric layer over a bottom electrode layer, forming a top electrode layer over the dielectric layer to form laminations of the bottom electrode layer, the dielectric layer and the top electrode layer, and selectively etching the laminations to form a capacitor, the dielectric layer being etched by a reactive ion etching so that the dielectric layer of the capacitor receives no substantive damage in the etching process.

96 Claims, 36 Drawing Sheets

METHOD OF FORMING A SEMICONDUCTOR MEMORY DEVICE

BACKGROUND OF THE INVENTION

The present invention relates to a method of forming a semiconductor memory device, and more particularly to a method of forming a semiconductor memory device using a ferroelectric or high dielectric.

A ferroelectric memory serving as a capacitor has a combined structure of a semiconductor with a ferroelectric layer such as $SrBi_2TaO_9$ (hereinafter referred to as SBT), wherein the capacitor is capable of storing "0" and "1" signals by utilizing residual polarization of the ferroelectric. FIG. 1 is a graph illustrative of variations in polarization of a ferroelectric over bias voltage applied to the ferroelectric.

After a positive bias has been applied to the ferroelectric capacitor, then the bias voltage becomes zero. Nevertheless, the polarization is not returned to zero, but a residual polarization Pr remains. By contrast, after a negative bias has been applied to the ferroelectric capacitor, then the bias voltage becomes zero. Nevertheless, the polarization is not returned to zero, but a residual polarization—Pr remains. It is possible to judge "0" and "1" by reading out the residual polarization. This means that the capacity of the ferroelectric is used as a memory. "1" or "0" remains stored after the power off, for which reason the ferroelectric memory is performed as anon-volatile memory.

Fabrication processes for that memory are disclosed in International Patent Publication No. WO93/12542. FIGS. 2A through 2P are fragmentary cross sectional elevation views illustrative of a conventional method of forming a semiconductor memory device using ferroelectric.

With reference to FIG. 2A, a bottom electrode layer 2 is formed on a silicon dioxide layer 1. The bottom electrode layer 2 comprises laminations of a Pt layer extending over the silicon dioxide layer 1 and a Ti layer extending over the Pt layer. A ferroelectric layer 3 is formed on the bottom electrode layer 2. The ferroelectric layer 3 is made of SBT. A top electrode layer 4 made of Pt is provided on the ferroelectric layer 3.

With reference to FIG. 2B, a photo-resist layer 5 is selectively provided on the top electrode layer 4.

With reference to FIG. 2C, the top electrode 4 partially covered by the photo-resist film 5 serving as a mask is etched by a sputter effect of Ar ions in an ion milling method.

With reference to FIGS. 2D and 2E, the ferroelectric layer 3 is subsequently etched by use of the photo-resist as a mask by the sputter effect of Ar ions in the ion milling method so as to define ridged laminations of the of the ferroelectric layer 3 and the top electrode 4 and also show partially the top surface of the bottom electrode 2.

With reference to FIG. 2F, the used photo-resist is removed by a plasma etching method such as ashing of oxygen plasma.

With reference to FIG. 2G, a heat treatment to the substrate 1 is carried out at a temperature of 800° C. in oxygen atmosphere for 30 minutes to recover crystal defects having been generated in the ferroelectric layer 3 in the above etching processes. This heat treatment is necessary because if no heat treatment were carried out, then a density of leak current is not less than 1 A/cm² when applied with a voltage of 3V whereby the capacitor is not longer useable. A temperature of 800° C. corresponds to a temperature of crystallization of the ferroelectric layer 3, for which reason the above heat treatment can recover the crystal defects whereby the density of leak current is reduced to the order of $10^{-7}$ A/m² when applied with a voltage of 5V. As a result, the capacitor is useable.

Further, the capacitor is processed to form a semiconductor memory device by forming interconnections.

With reference to FIG. 2H, as described above, the capacitor is fabricated which comprises the ferroelectric layer 3 sandwiched by the top and bottom electrode layers 4 and 2.

With reference to FIG. 2I, an inter-layer insulator 11 made of non-doped silicon glass is entirely formed which covers the capacitor and the silicon oxide film 1.

With reference to FIG. 2J, a photo-resist film 12 is selectively formed on the inter-layer insulator 11 so that an opening of the photo-resist film 12 is positioned over the top electrode 4.

With reference to FIG. 2K, the inter-layer insulator 11 except for it part covered by the photo-resist 12 is selectively etched by a plasma etching by use of $CHF_3$ to form a contact hole in the inter-layer insulator 11 so that a part of the top surface of the top electrode 4 is shown through the contact hole. With reference to FIG. 2L, the used photo-resist 12 is removed.

With reference to FIG. 2K an interconnection layer 13 is entirely formed which extends over the inter-layer insulator 11 and within the contact hole so that the interconnection layer 13 is made into contact with the top surface of the top electrode 4. The interconnection layer 13 comprises laminations of a titanium layer, a titanium nitride layer laminated on the titanium layer and an aluminum layer laminated on the titanium nitride layer.

With reference to FIG. 2N, a photo-resist film 14 is selectively formed on the interconnection layer 13.

With reference to FIG. 2O, the interconnection layer 13 except for its part covered by the photo-resist film 14 is selectively etched by a plasma etching using $BCl_3$.

With reference to FIG. 2P, the used photo-resist film 14 is removed whereby the semiconductor memory device is completed.

The conventional method described above has the following problems. The laminations of the bottom electrode layer 2, the ferroelectric layer 3 and the top electrode layer 4 have been formed before the laminations are patterned by the ion-milling method which is, however, disadvantageous in an extremely low etching rate of 12 nm/min. because of a physical etching by use of Ar ions. Usually, the ferroelectric layer 3 of SBT has a thickness of about 180 nanometers. It takes about 15 minutes to etch the ferroelectric layer 3 by the ion-milling method. This means that the productivity is extremely low when the ion-milling method is used to define the capacitor. In this ion-milling method, ion impacts by Ar sputter atoms of the ferroelectric layer, for which reason etching damage is relatively large and a large number of crystal defects are formed in the ferroelectric layer. This large number of the crystal defects causes an increased leakage of current flowing through the ferroelectric layer. To prevent the leakage of current, it is required to recover the crystal defects by carrying out a heat treatment at a high temperature of 800° C. which is also required to crystallize SBT of the ferroelectric layer.

The above capacitor might be formed over a base layer or a base substrate having integrated circuits which include impurity doped layers and interconnections. The heat treatment at such a high temperature provides undesirable influences to distributions of impurity concentrations of the impurity doped layers and materials of the interconnections. In order to prevent the undesirable influences to the distributions of impurity concentrations of the impurity doped layers and the materials of the interconnections, it is required to do a possible reduction in the number of the high temperature heat treatments or to drop the temperature of the heat treatment down to, for example, 600° C. which might provide no substantive influence to the base layer or the base substrate.

The etching damage is caused not only when the ferroelectric layer has been etched but also when another layers such as inter-layer insulators and interconnections are then etched later. In this case, the mechanism of the etching damage is different between when the ferroelectric layer has been etched and when another layers such as inter-layer insulators and interconnections are then etched later. The above ferroelectric layer is made of SBT, whilst the inter-layer insulators are made of silicon dioxide and the interconnection layers may be made of aluminum. In order to etch the materials other than SBT film, reducing gases such as $CHF_3$ or $BCl_3$ are used whereby a reducing reaction is caused, resulting in an oxygen deficiency.

Even if no such reducing gas is used but a high etching rate gas such as Cl2 possessing a high etching rate to the resist is used, then the resist film used for selective etching is decomposed by a reaction of Cl with O. Such reaction of Cl with 0 generates H which might provide the influences to the SBT ferroelectric film.

After the aluminum interconnection layer has been etched, then a high temperature heat treatment could never be carried out in order to avoid oxidation of aluminum or avoid malting of aluminum. Particularly, etching to aluminum is problem. In this case, the reducing function is smaller than the above case. Notwithstanding, not only the leakage of current is increased but also deteriorations of the reliability and durability by aging of the capacitor as well as deteriorations of endurance to the operations of writing data into the memory are also problem.

In the above circumstances, it bad been required to develop a novel method of forming a semiconductor memory device free from the above problems and disadvantages as described above.

SUMMARY OF THE INVENTION

Accordingly, it is an object of the present invention to provide a novel method of forming a semiconductor memory device free from the above problems.

It is a further object of the present invention to provide a novel method of forming a semiconductor memory device, which is capable of preventing any substantive deterioration of a dielectric layer of a capacitor in any etching processes to be carried out after the capacitor has been formed.

It is a still further object of the present invention to provide a novel method of forming a semiconductor memory device, which is capable of recovery of a substantive deterioration of a dielectric layer of a capacitor.

The above and other objects, features and advantages of the present invention will be apparent from the following descriptions.

The present invention also provides a method of forming a capacitor. The method comprises the steps of forming a dielectric layer over a bottom electrode layer, forming a top electrode layer over the dielectric layer to form laminations of the bottom electrode layer, the dielectric layer and the top electrode layer, and selectively etching the laminations to form a capacitor, wherein at least the dielectric layer is etched by a reactive ion etching so that the dielectric layer of the capacitor receives no substantive damage in the etching process.

BRIEF DESCRIPTION OF THE DRAWINGS

Preferred embodiments according to the present invention will be described in detail with reference to the accompanying drawings.

DISCLOSURE OF THE INVENTION

Figure 1:
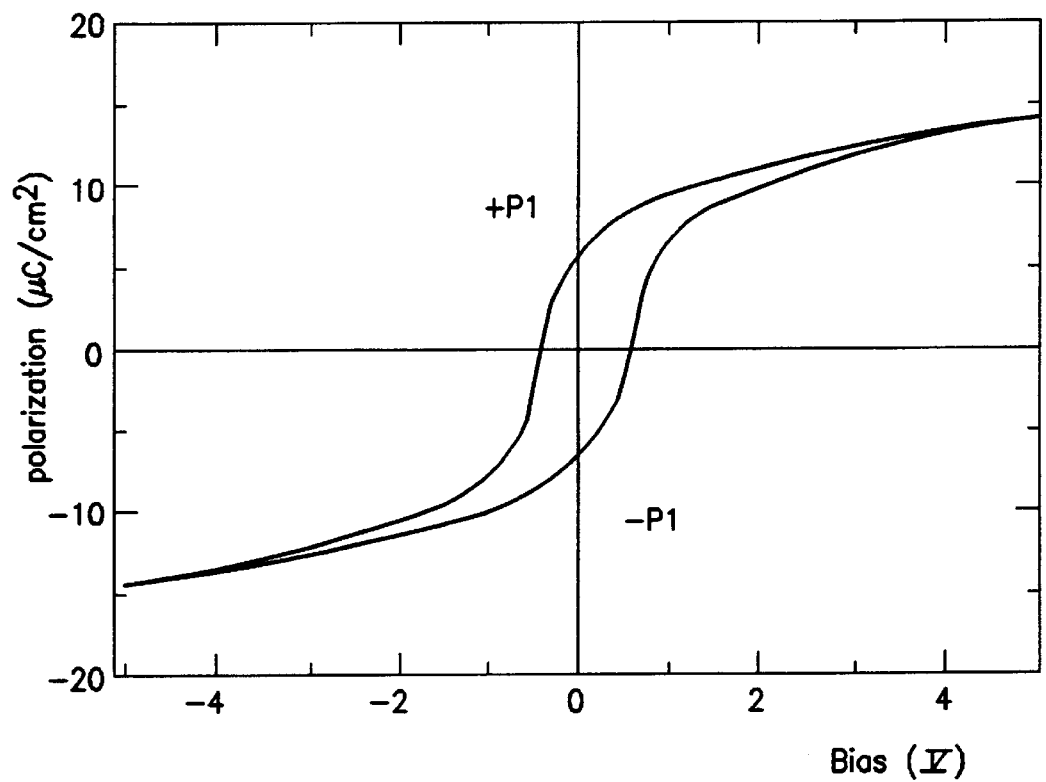
FIG. 1 is a graph illustrative of hysteresis loops of the capacitor which have been etched by the ion-milling.
Figure 2A:
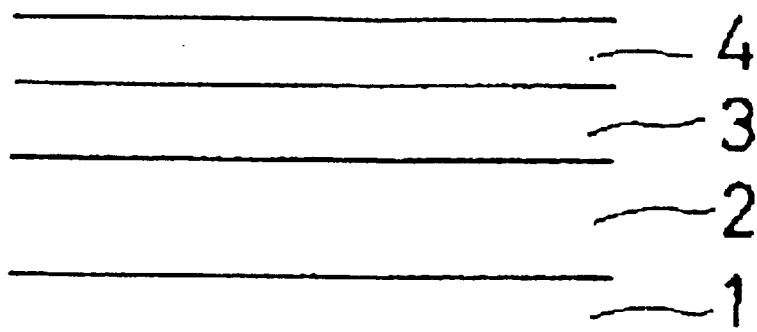
FIGS. 2A through 2P are fragmentary cross sectional elevation views illustrative of a conventional method of forming a semiconductor memory device using ferroelectric.
Figure 2B:
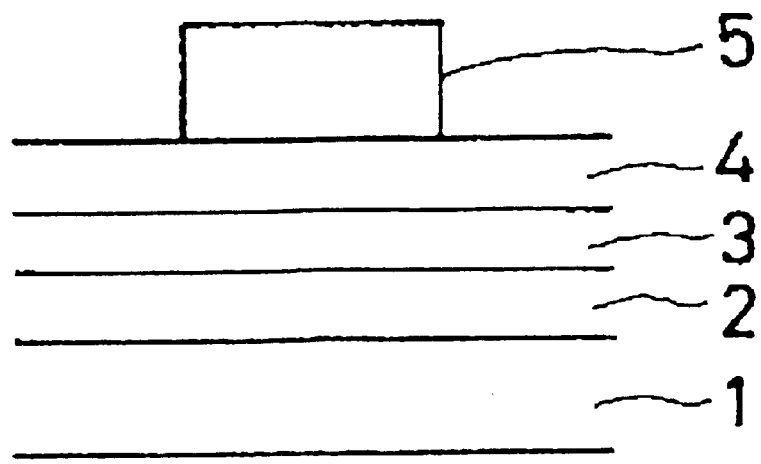
Figure 2C:
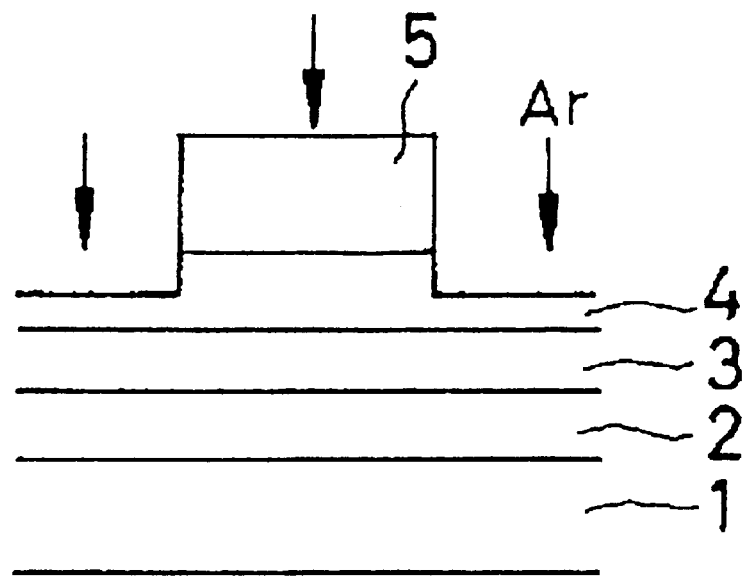
Figure 2D:
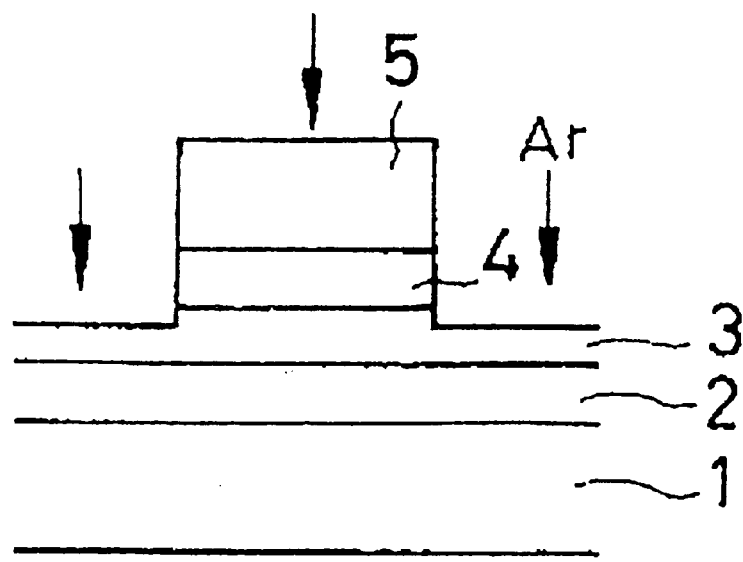
Figure 2E:
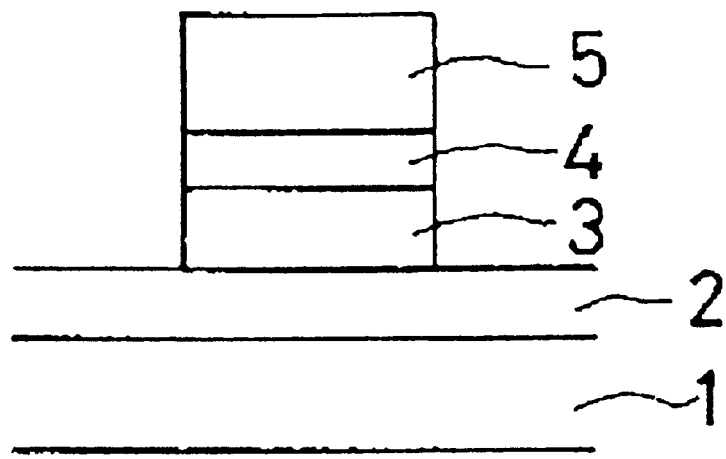
Figure 2F:
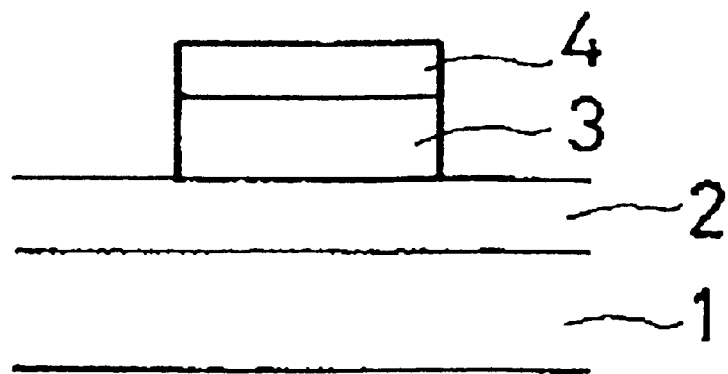
Figure 2G:
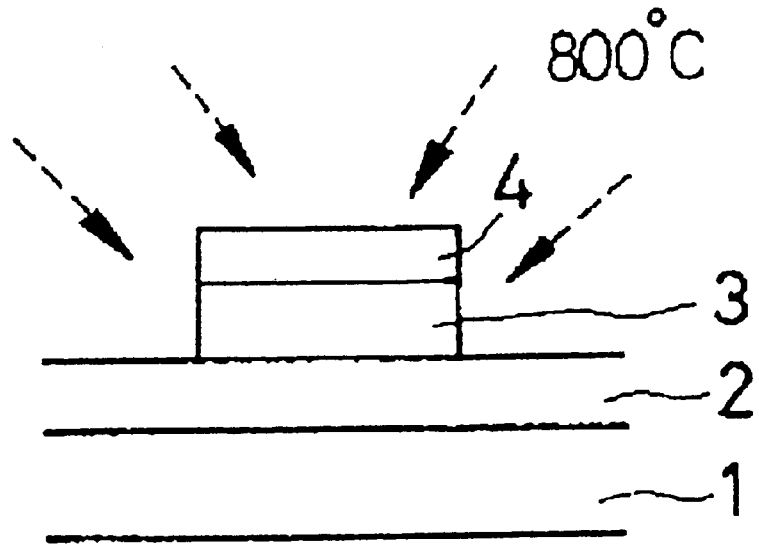
Figure 2H:
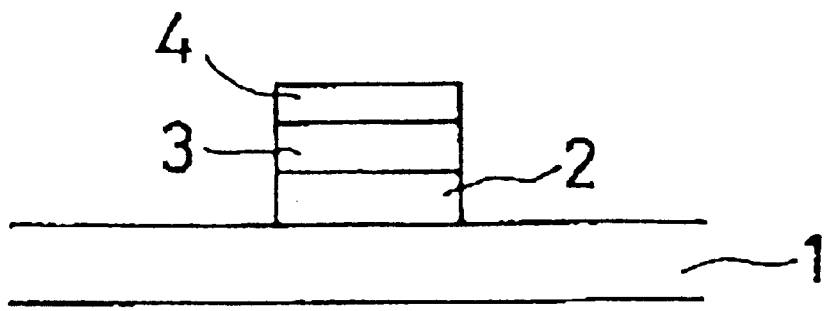
Figure 2I:
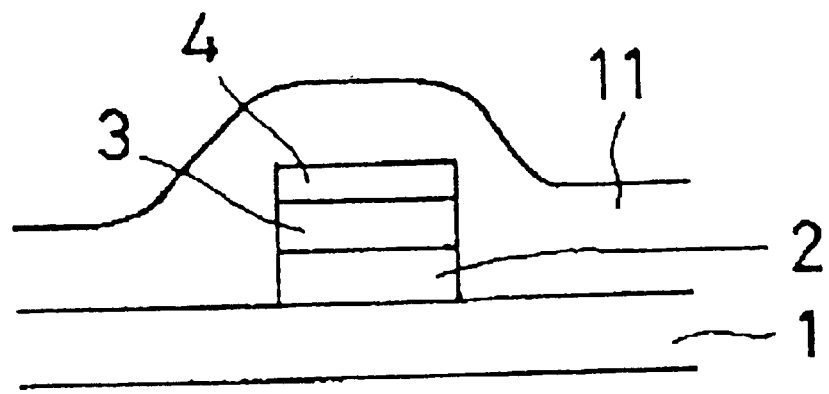
Figure 2J:
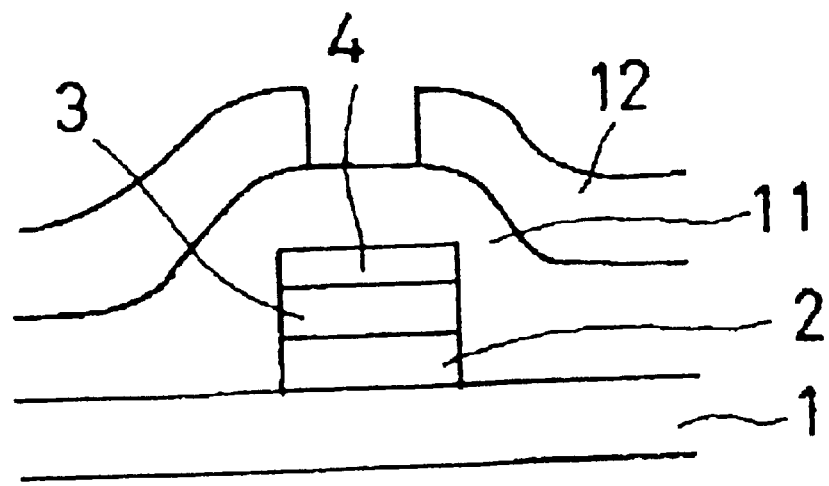
Figure 2K:
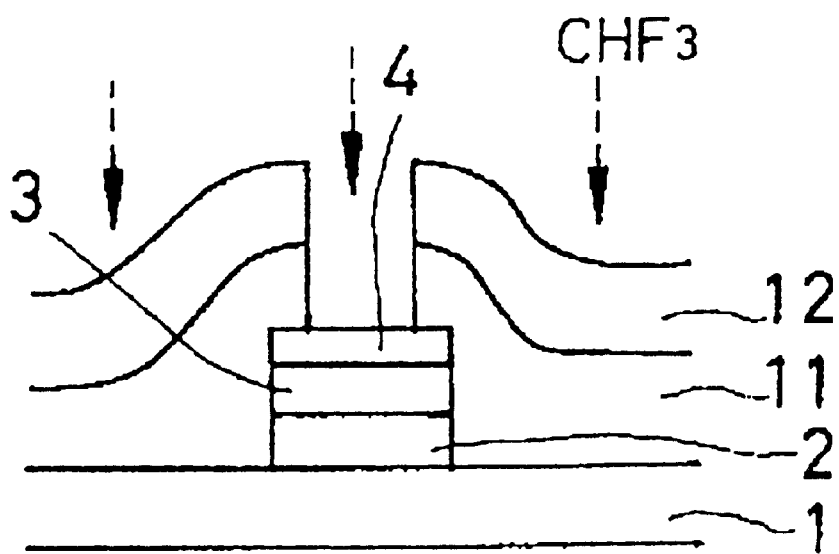
Figure 2L:
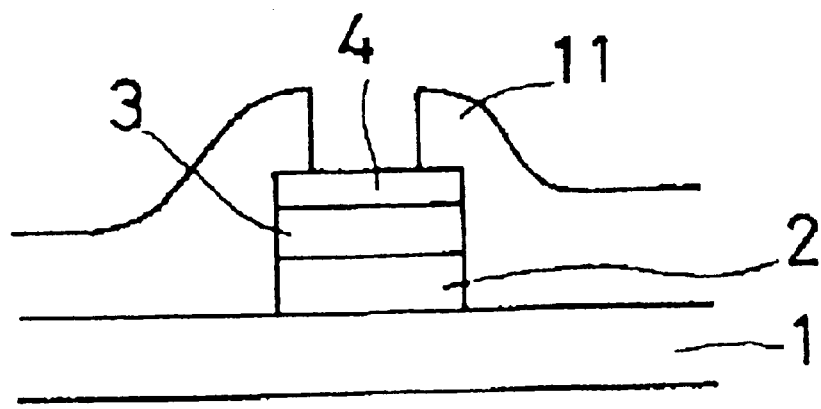
Figure 2M:
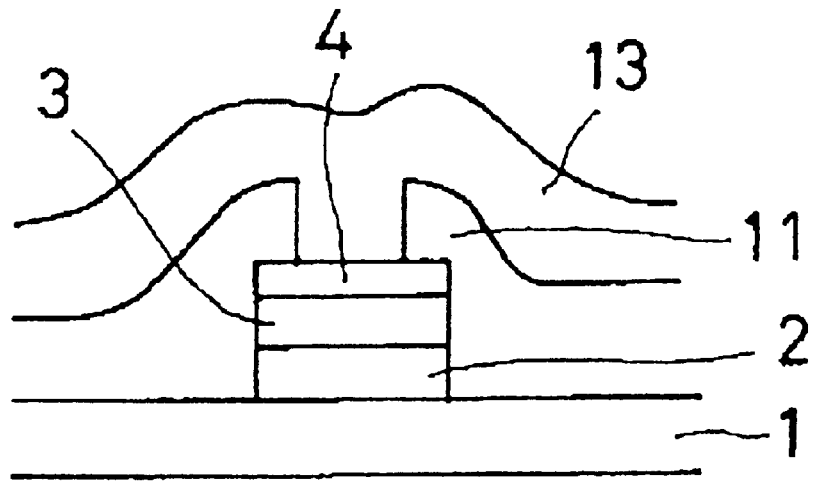
Figure 2N:
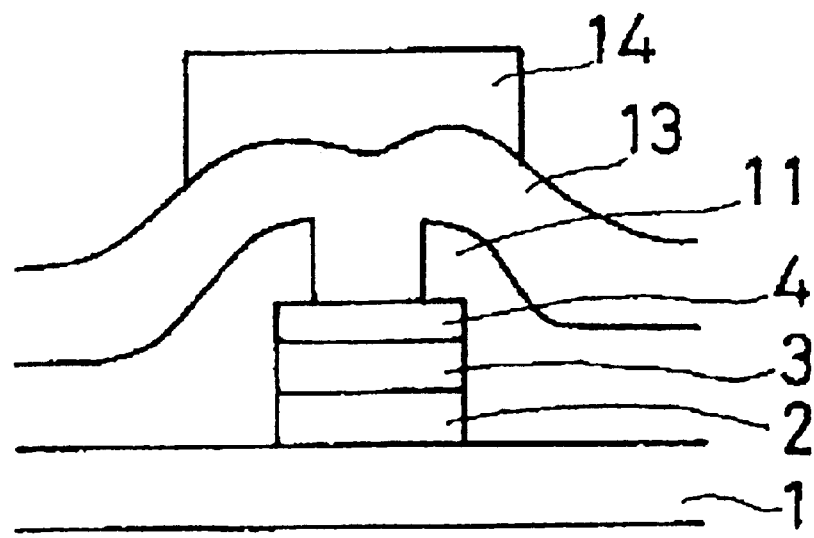
Figure 2O:
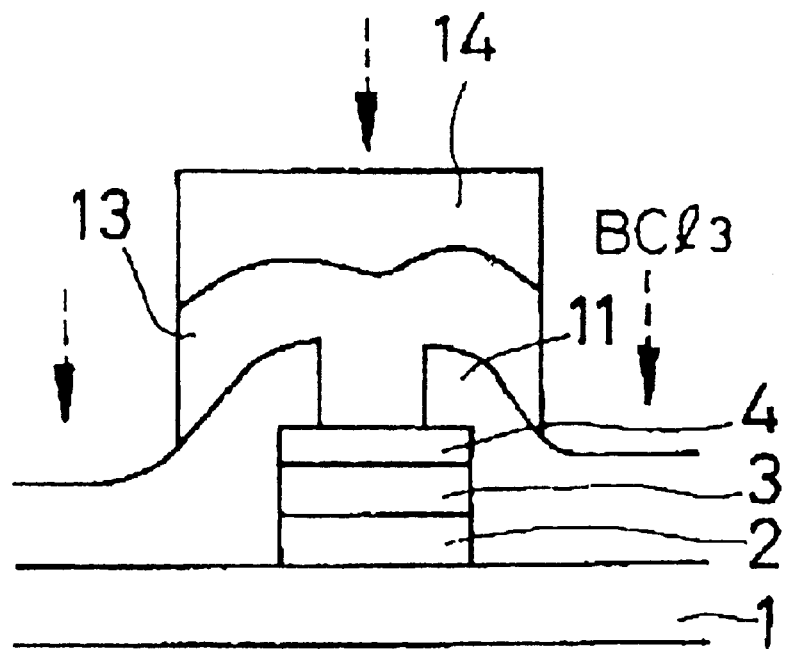
Figure 2P:
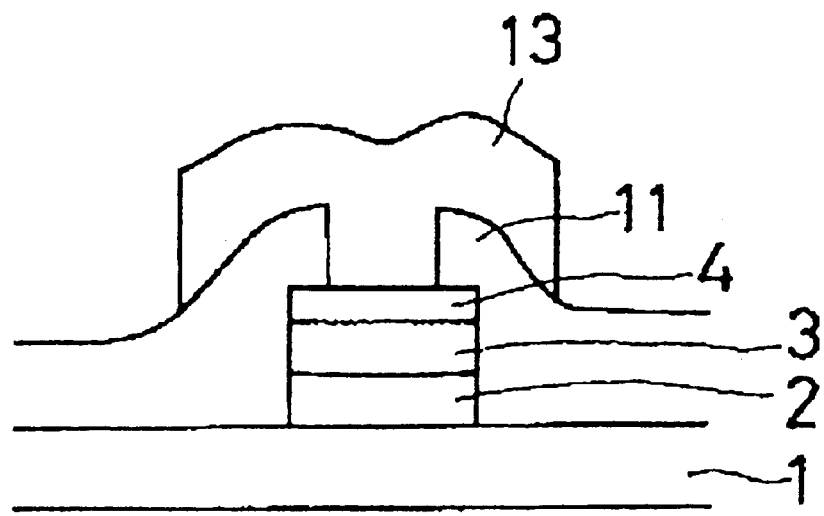

The first present invention provides a method of defining a dielectric layer of a capacitor. The method comprises the step of selectively etching the dielectric layer by a reactive ion etching so that the dielectric layer of the capacitor receives no substantive damage in the etching process.

It is preferable that the dielectric layer is made of a dielectric material having a high dielectric constant. In this case, it is flier preferable that the dielectric martial is a ferroelectric material which shows a ferroelectric property. It is furthermore preferable that the ferroelectric material is $SrBi_2Ta_2O_9$. It is also preferable that the ferroelectric material is $Pb(Zr_xT_{1-x})O_3$.

It is also preferable that the dielectric material shows a ferroelectric property. In this case, it is fewer preferable that the ferroelectric material is $(Ba_xSr_{1-x})TiO_3$.

It is also preferable that the dielectric martial is an oxide material which shows a deterioration by a reduction reaction.

It is also preferable that the reactive ion etching is oxided out by use of a reactive gas including chlorine. In this case, it is fisher preferable that the reactive gas includes $BCl_3$. It is furthermore preferable that the reactive gas includes a mixture of $BCl_3$ with Ar. It is moreover preferable that a ratio of $BCl_3$ to the mixture is about 10%. It is also moreover preferable that oxygen is further added to the reactive gas at about 10%.

It is also preferable that the reactive ion etching is carried out by use of a reactive gas including $CHF_3$. In this case, it is further preferable that the reactive gas includes a mixture of $CHF_3$ with Ar. It is furthermore preferable that a ratio of $CBF_3$ to the mixture is about 10%. It is also preferable that oxygen is further added to the reactive gas at about 10%.

It is also preferable that the reactive ion etching is an electron cyclotron resonance plasma etching.

It is also preferable to further comprise the step of carrying out a heat treatment at a temperature of not higher than 600° C. In this case, it is further preferable that the heat treatment is carried out in an oxygen atmosphere. It is also preferable that the heat treatment is carried out in a nitrogen atmosphere. It is also preferable that the heat treatment is carried out in vacuum.

The second present invention also provides a method of forming a capacitor. The method comprises the steps of forming a dielectric layer over a bottom electrode layer, forming a top electrode layer over the dielectric layer to form laminations of the bottom electrode layer, the dielectric layer and the top electrode layer, and selectively etching the laminations to form a capacitor, wherein at least the dielectric layer is etched by a reactive ion etching so that the dielectric layer of the capacitor receives no substantive damage in the etching process.

It is preferable that the top electrode layer is also etched by the reactive ion etching. In this case, it is preferable that the bottom electrode layer is also etched by the reactive ion etching.

It is also preferable that the dielectric layer is made of a dielectric material having a high dielectric constant. In this case, it is preferable that the dielectric material is a ferroelectric material which shows a ferroelectric property. In this case, it is also preferable that the ferroelectric material is $SrBi_2Ta_2O_9$. It is also preferable that the ferroelectric material is $Pb(Zr_xTi_{1-x})O_3$.

It is also preferable that the dielectric martial shows non-ferroelectric property. In this case, it is preferable that the ferroelectric material is $(Ba_xSr_{1-x})TiO_3$.

It is also preferable that the dielectric martial is an oxide material which shows a deterioration by a reduction reaction.

It is also preferable that the reactive ion etching is carried out by use of a reactive gas including chlorine. In this case, it is preferable that the reactive gas includes $BCl_3$. It is also preferable that the reactive gas includes a mixture of $BCl_3$ with Ar. It is further preferable that a ratio of $BCl_3$ to the mixture is about 10%. It is also preferable that oxygen is further added to the reactive gas at about 10%.

It is also preferable that the reactive ion etching is carried out by use of a reactive gas including $CHF_3$. In this case, it is preferable that the reactive gas includes a mixture of $CHF_3$ with Ar. It is further preferable that a ratio of $CHF_3$ to the mixture is about 10%. It is furthermore preferable that oxygen is further added to the reactive gas at about 10%.

It is also preferable that the reactive ion etching is an electron cyclotron resonance plasma etching.

It is also preferable to further comprise the step of carrying out a heat treatment at a temperature of not higher than 600° C. after at least the dielectric layer has been etched by the reactive ion etching. In this case, it is preferable that the heat treatment is carried out in an oxygen atmosphere. It is further preferable that the heat treatment is carried out in a nitrogen atmosphere. It is also preferable that the heat treatment is carried out in vacuum.

It is also preferable to further comprise the steps of forming an insulation layer which covers the capacitor, and selectively etching the insulation layer by a reactive ion etching. In this case, it is preferable that the reactive ion etching is carried out by use of a reactive gas including $CHF_3$. It is further preferable that oxygen is further added to the reactive gas at about 10%.

It is also preferable that the reactive ion etching is an electron cyclotron resonance plasma etching.

It is also preferable to further comprise the step of carrying out a heat treatment at a temperature of not higher than 600° C. after the insulation layer has been etched by the reactive ion etching. In this case, it is preferable that the heat treatment is carried out in an oxygen atmosphere. It is also preferable to fisher comprise the steps of forming a conductive layer over the insulation layer, and selectively etching the conductive layer by a reactive ion etching. In this case, it is preferable that the reactive ion etching is carried out by use of a reactive gas including $Cl_2$. It is further preferable that oxygen is further added to the reactive gas at about 10%. It is further preferable that the reactive ion etching is an electron cyclotron resonance plasma etching. It is further preferable to comprise the step of carrying out a heat treatment at a temperature of not higher than 400° C. after the conductive layer has been etched by the reactive ion etching. In this case, it is preferable that the heat treatment is carried out in a nitrogen atmosphere.

It is also preferable to further comprise the steps of forming a conductive layer over the insulation layer, forming a non-doped silicon glass layer over the conductive layer, selectively etching the non-doped silicon glass layer to form a non-doped silicon glass mask over the conductive layer, selectively etching the conductive layer by a reactive ion etching with use of the non-doped silicon glass mask, and removing the non-doped silicon glass mask. In this case, it is preferable that the non-doped silicon glass layer is selectively etched by use of a resist as a mask and by an electron cyclotron resonance plasma etching using $CF_4$ as an etching gas. It is also preferable that the non-doped silicon glass layer is selectively etched by use of a resist as a mask and by an electron cyclotron resonance plasma etching using $CHF_3$ as an etching gas. It is also preferable that the reactive ion etching to the conductive layer is carried out by use of an reactive gas including chlorine. It is also preferable to further comprise the step of carrying out a heat treatment at a temperature of about 300° C. in a nitrogen atmosphere after the non-doped silicon glass mask has been removed. It is also preferable that the non-doped silicon glass layer is deposited by a chemical vapor deposition method at a temperature of not more than 400° C.

It is also preferable that the capacitor is formed over an insulation film over a semiconductor substrate having a semiconductor integrated circuit.

It is also preferable that the capacitor is formed on a semiconductor substrate having a semiconductor integrated circuit.

The third present invention provides a method of forming a semiconductor memory device. The method comprises the steps of forming a dielectric layer having a high dielectric constant over a bottom electrode layer, forming a top electrode layer over the dielectric layer to form laminations of the bottom electrode layer, the dielectric layer and the top electrode layer, selectively etching the laminations to form a capacitor, carrying out a first heat treatment at a temperature of not higher 600° C. after at least the dielectric layer has been etched, forming an inter-layer insulator which covers the capacitor, selectively etching the inter-layer insulator, carrying out a second heat treatment at a temperature of not higher than 600° C. after the inter-layer insulator has been etched, forming an interconnection layer over the inter-layer insulator, selectively etching the interconnection layer, and carrying out a third heat treatment at a temperature of not higher than 400° C., wherein at least the dielectric layer is etched by a reactive ion etching so that the dielectric layer of the capacitor receives no substantive damage in the etching process.

It is preferable that the top electrode layer is also etched by the reactive ion etching. In this case, it is also preferable that the bottom electrode layer is also etched by the reactive ion etching. It is further preferable that the dielectric material is a ferroelectric material which shows a ferroelectric property. It is furthermore preferable that the ferroelectric material is $SrBi_2Ta_2O_9$. It is also preferable that the ferroelectric material is $Pb(Zr_xTi_{1-x})O_3$.

It is also preferable that the dielectric martial shows non-ferroelectric property. In this case, it is also preferable that the ferroelectric material is $(Ba_xSr_{1-x})TiO_3$. It is further preferable that the dielectric martial is an oxide material which shows a deterioration by a reduction reaction.

It is also preferable that the reactive ion etching to the dielectric layer is carried out by use of a reactive gas including chlorine. In this case, it is also preferable that the reactive gas includes $BCl_3$. It is further preferable that the reactive gas includes a mixture of $BCl_3$ with Ar. It is furthermore preferable that a ratio of $BCl_3$ to the mixture is about 10%. It is also preferable that oxygen is further added to the reactive gas at about 10%.

It is also preferable that the reactive ion etching to the dielectric layer is carried out by use of a reactive gas including $CBF_3$. In this case, it is a so preferable that the reactive gas includes a mixture of $CHF_3$ with Ar. It is further preferable that a ratio of $CHF_3$ to the mixture is about 10%. It is further preferable that oxygen is further added to the further reactive gas at about 10%.

It is also preferable that the reactive ion etching to the dielectric layer is an electron cyclotron resonance plasma etching.

It is also preferable that the first heat treatment is carried out in an oxygen atmosphere. It is also preferable that the first heat treatment is carried out in a nitrogen atmosphere. It is also preferable that the fist heat treatment is carried out in vacuum.

It is also preferable that the inter-layer insulator is also etched by a further reactive ion etching which is carried out by use of a reactive gas including $CBF_3$. In this case, it is also preferable that oxygen is further added to the reactive gas at about 10%. It is also preferable that the further reactive ion etching is an electron cyclotron resonance plasma etching.

It is also preferable that the second heat treatment is carried out in an oxygen atmosphere.

It is also preferable that the interconnection layer is also etched by a furthermore reactive ion etching which is carried out by use of a reactive gas including $Cl_2$. It is also preferable that oxygen is further added to the reactive gas at about 10%. It is also preferable that the furthermore reactive ion etching is an electron cyclotron resonance plasma etching.

It is also preferable that the third heat treatment is carried out in a nitrogen atmosphere.

It is also preferable that the capacitor is formed over an insulation film over a semiconductor substrate having a semiconductor integrated circuit. It is also preferable that the capacitor is formed on a semiconductor substrate having a semiconductor integrated circuit.

The fourth present invention also provides a method of forming a semiconductor memory device. The method comprises the steps of forming a dielectric layer having a high dielectric constant over a bottom electrode layer, forming a top electrode layer over the dielectric layer to form laminations of the bottom electrode layer, the dielectric layer and the top electrode layer, selectively etching the laminations to form a capacitor, carrying out a first heat treatment at a temperature of not higher than 600° C. after at least the dielectric layer has been etched forming an inter-layer insulator which covers the capacitor, selectively etching the inter-layer insulator, carrying out a second heat treatment at a temperature of not higher than 600° C., forming an interconnection layer over the inter-layer insulator, forming a non-doped silicon glass layer over the interconnection layer, selectively etching the non-doped silicon glass layer to form a non-doped silicon glass mask over the interconnection layer, selectively etching the interconnection layer by use of the non-doped silicon glass mask, removing the non-doped silicon glass mask, and carrying out a third heat treatment at a temperature of about 300° C. in a nitrogen atmosphere, wherein at least the dielectric layer is etched by a reactive ion etching so that the dielectric layer of the capacitor receives no substantive damage in the etching process.

It is preferable that the top electrode layer is also etched by the reactive ion etching. In this case, it is also preferable that the bottom electrode layer is also etched by the reactive ion etching. It is further preferable that the dielectric material is a ferroelectric material which shows a ferroelectric property. It is furthermore preferable that the ferroelectric material is $SrBi_2Ta_2O_9$. It is also preferable that the ferroelectric material is $Pb(Zr_xTi_{1-x})O_3$.

It is also preferable that the dielectric martial shows non-ferroelectric property. In this case, it is also preferable that the ferroelectric material is $(Ba_xSr_{1-x})TiO_3$. In this case, it is also preferable that the dielectric martial is an oxide material which shows a deterioration by a reduction reaction.

It is also preferable that the reactive ion etching to the dielectric layer is carried out by use of a reactive gas including chlorine. In this case, it is also preferable that the reactive gas includes $BCl_3$. It is also preferable that the reactive gas includes a ire of $BCl_3$ with Ar. It is also preferable that a ratio of $BCl_3$ to the mixture is about 10%. It is also preferable that oxygen is further added to the reactive gas at about 10%.

It is also preferable that the reactive ion etching to the dielectric layer is carried out by use of a reactive gas including $CHF_3$. In this case, it is also preferable that the reactive gas includes a mixture of $CBF_3$ with Ar. It is also preferable that a ratio of $CHF_3$ to the mixture is about 10%. It is also preferable that oxygen is further added to the further reactive gas at about 10%.

It is also preferable that the reactive ion etching to the dielectric layer is an electron cyclotron resonance plasma etching.

It is also preferable that the first heat treatment is carried out in an oxygen atmosphere. It is also preferable that the first heat treatment is carried out in a nitrogen atmosphere. It is also preferable that the first heat treatment is carried out in vacuum.

It is also preferable that the inter-layer insulator is also etched by a further reactive ion etching which is carried out by use of a reactive gas including $CHF_3$. In this case, it is also preferable that oxygen is further added to the reactive gas at about 10%. It is also preferable that the further reactive ion etching is an electron cyclotron resonance plasma etching.

It is also preferable that the second heat treatment is carried out in an oxygen atmosphere.

It is also preferable that the non-doped silicon glass layer is selectively etched by use of a resist as a mask and by an electron cyclotron resonance plasma etching using $CF_4$ as an etching gas.

It is also preferable that the non-doped silicon glass layer is selectively etched by use of a resist as a mask and by an electron cyclotron resonance plasma etching using $CHF_3$ as an etching gas.

It is also preferable that the interconnection layer is also etched by a furthermore reactive ion etching which is carried out by use of an reactive gas including chlorine. In this case, it is also preferable that oxygen is further added to the reactive gas at about 10%. It is also preferable that the furthermore reactive ion etching is an electron cyclotron resonance plasma etching.

It is also preferable that the non-doped silicon glass layer is deposited by a chemical vapor deposition method at a temperature of not more than 400° C.

It is also preferable that the third heat treatment is carried out in a nitrogen atmosphere.

It is also preferable that the capacitor is formed over an insulation film over a semiconductor substrate having a semiconductor integrated circuit. It is also preferable that the capacitor is formed on a semiconductor substrate having a semiconductor integrated circuit.

The fifth present invention provides a method of forming an interconnection over an inter-layer insulator. The method comprising the steps of forming an interconnection layer entirely over an inter-layer insulator, selectively forming a non-doped silicon glass film on the interconnection layer, selectively etching said interconnection layer by a reactive ion etching with use of the non-doped silicon glass film as a mask to define an interconnection, and removing said non-doped silicon glass film. It is preferable that the reactive ion etching is an electron cyclotron resonance etching.

PREFERRED EMBODIMENTS

FIRST EMBODIMENT

A first embodiment according to the present invention will be described in detail with reference to FIGS. 3A through 3S which are fragmentary cross sectional elevation views illustrative of a novel method of forming a semiconductor memory device having a capacitor including a dielectric film of a high dielectric constant.

Figure 3A:
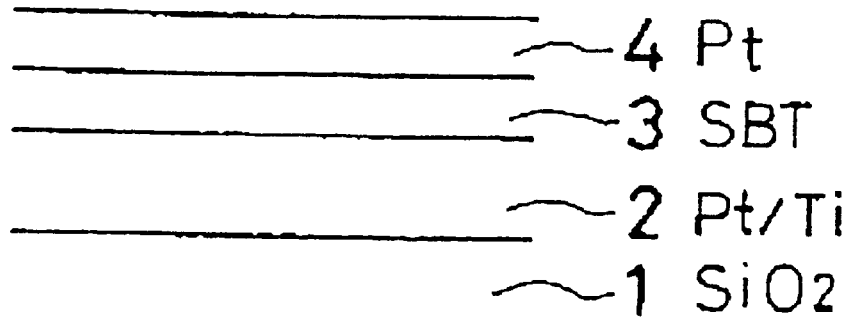
FIGS. 3A through 3S which are fragmentary cross sectional elevation views illustrative of a novel method of forming a semiconductor memory device having a capacitor including a dielectric film of a high dielectric constant in a first embodiment in accordance with the present invention.

With reference to FIG. 3A, a bottom electrode layer 2 is formed on a silicon dioxide layer 1. The bottom electrode layer 2 comprises laminations of a platinum layer and a titanium layer. A ferroelectric layer 3 made of $SrBi_2Ta_2O_9$ (hereinafter referred to as SBT) is formed on the bottom electrode layer 2. A top electrode 4 of platinum is formed over the ferroelectric layer 3.

Figure 3B:
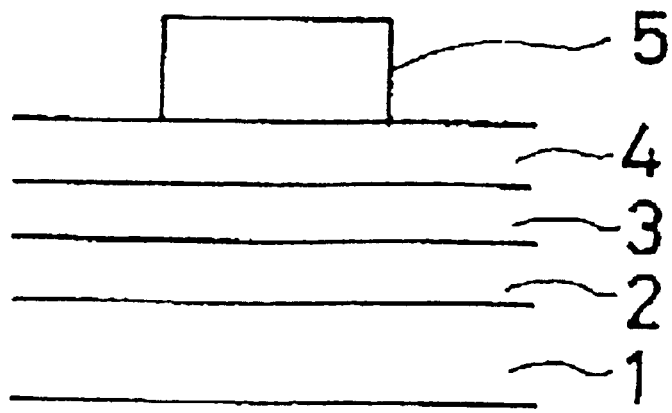

With reference to FIG. 3B, a photo-resist film 5 is selectively formed on a top surface of the top electrode layer 4.

Figure 3C:
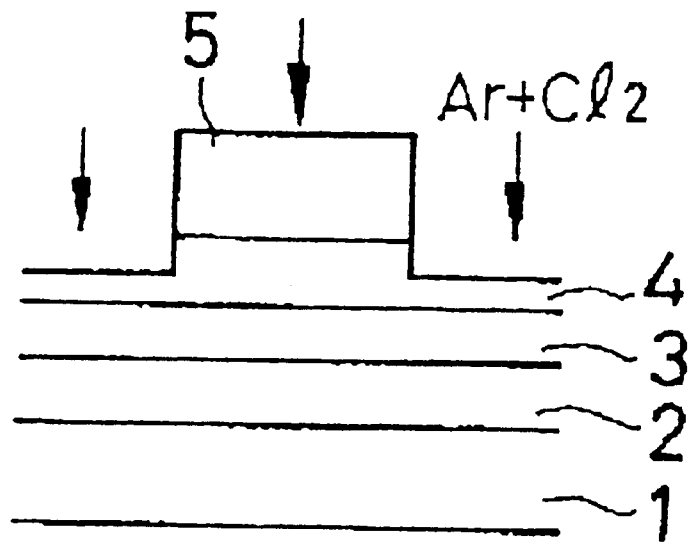

With reference to FIG. 3C, an electron cyclotron resonance plasma etching is carried out by use of a mixture gas of $Cl_2$ and Ar at a first compositional ratio as a reaction gas and by use of the photo-resist film 5 as a mask to selectively etch the top electrode layer 4. The first ratio of $Cl_2$ to Ar is so determined that a concentration of $Cl_2$ is about 20% or a concentration of Ar is 80%.

Figure 3D:
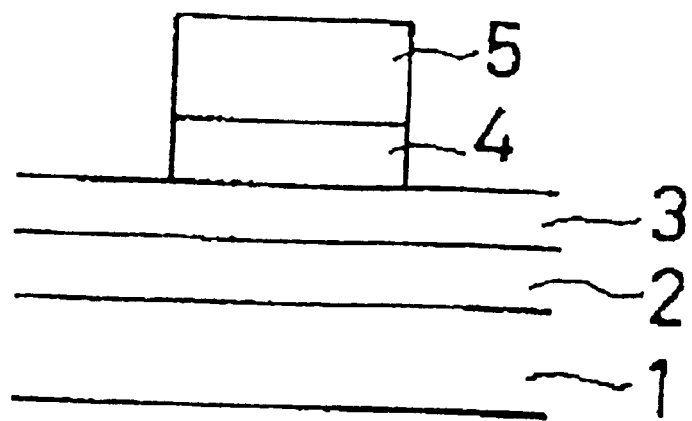

With reference to FIG. 3D, the top electrode 4 is defined which has the same size as the photo-resist 5.

Figure 3E:
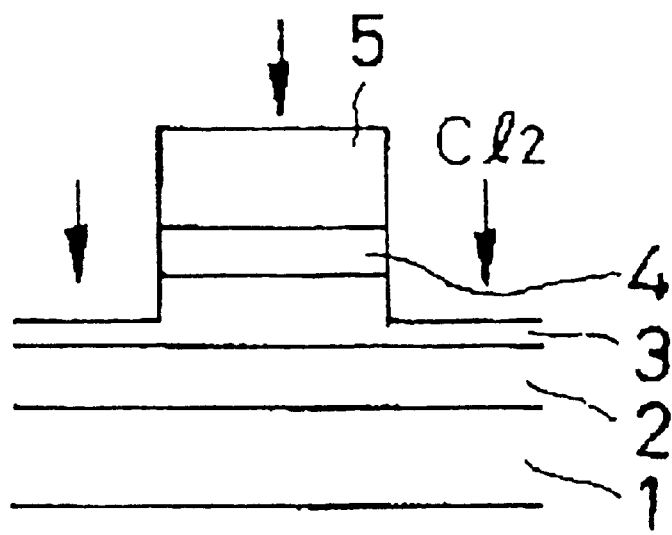

With reference to FIG. 3E, following to the above electron cyclotron resonance plasma etching, a further electron cyclotron resonance plasma etching is carried out by use of a mixture gas of $Cl_2$ and Ar at a second compositional ratio as a reaction gas and by use of the photo-resist film 5 as a mask to selectively etch the ferrodielectric layer 3. The second ratio of $Cl_2$ to Ar is so determined that a concentration of $Cl_2$ is about 10%. In the Per electron cyclotron resonance plasma etching, the substrate may be heated or cooled. The ferrodielectric layer 3 is made of $SrBi_2TaO_9$ (SBT). The constitutional elements of $SrBi_2TaO_9$ (SBT), for example, Sr, Bi and Ta are reacted with Cl thereby to form compounds of $SrCl_2$, $BiCl_3$, $TaCl_5$ respectively. Those compounds $SrCl_2$, $BiCl_3$, $TaCl_5$ have melting points which are not less than 20° C., for which reason those compounds are not evaporated but are sputtered by Ar ions which have been added. Coefficients of sputtering of those compounds are larger than that of the ferroelectric layer 3. It was experimentally confirmed that if the ferroelectric layer 3 is etched by the ion-milling method, then an etching rate is about 12 nanometers, whilst if the ferroelectric layer 3 is etched by the electron cyclotron resonance plasma etching method using the above mixed gases of chlorine and argon, then the etching rate is 46 nanometers.

Figure 3F:
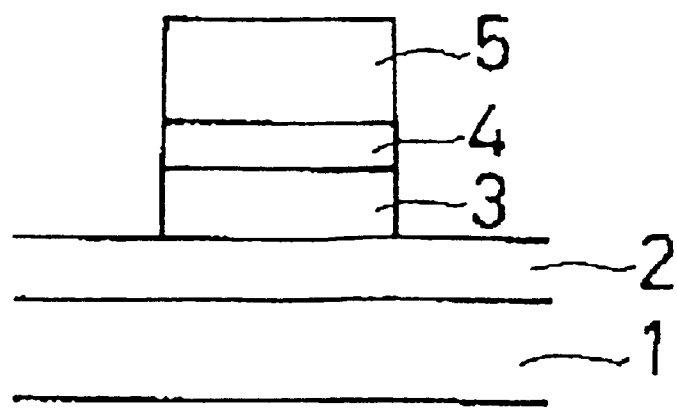

With reference to FIG. 3F, the ferrodielectric layer 3 is defined which has the same size as the photo-resist 5.

Figure 3G:
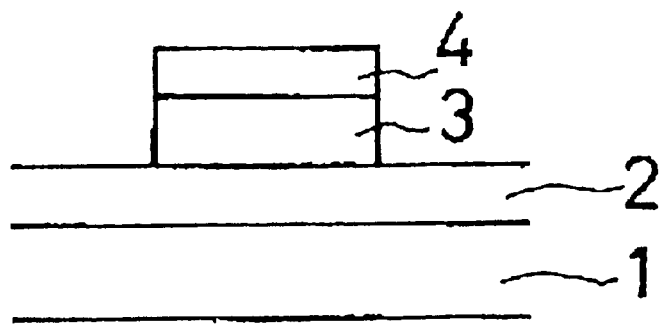
Figure 3H:
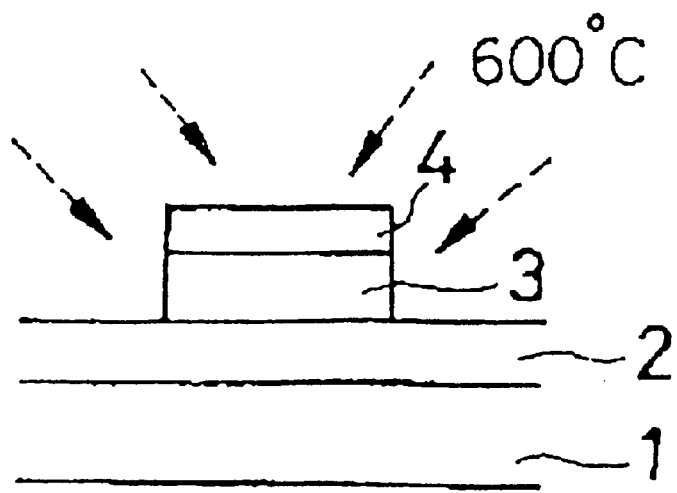

With reference to FIG. 3G, the used photo-resist 5 is removed by either ashing method of oxygen plasma or an organic solvent. By contrast, if the dielectric layer were etched by the ion-milling method, then the photo-resist film 5 is hardened whereby only the ashing method of oxygen plasma is available.

Figure 3I:
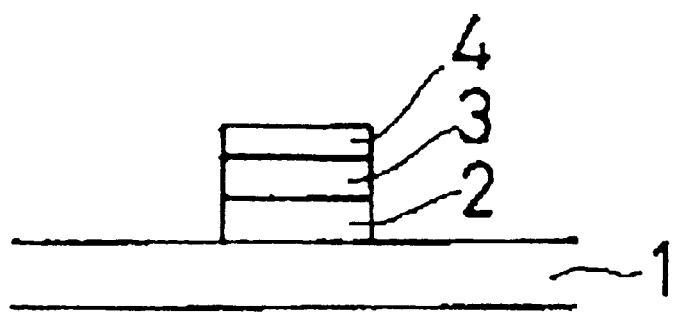
Figure 3J:
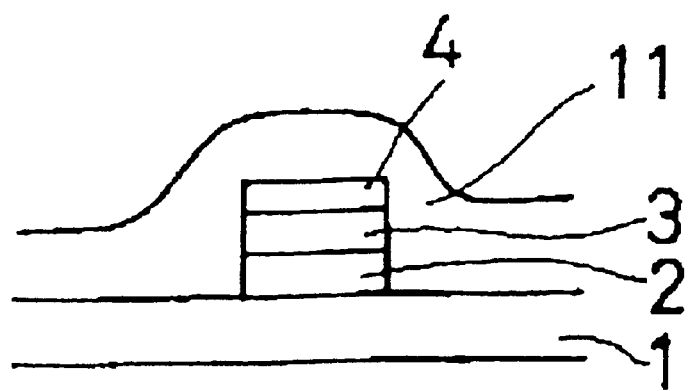
Figure 3K:
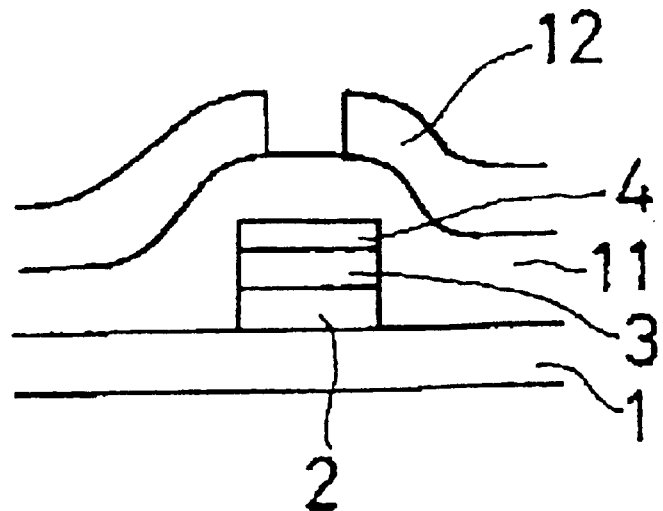

With reference to FIG. 3K, a heat treatment is carried out at a temperature of 600° C. for about 30 minutes in an oxygen atmosphere. As described above, the ferroelectric layer 3 receives no substantive damage in the reactive ion etching process but might receive a light damage. Such light damage of the ferroelectric layer 3 may be recovered by a relatively low temperature heat treatment, for example, not more than 600° C. in an oxygen atmosphere.

Figure 4:
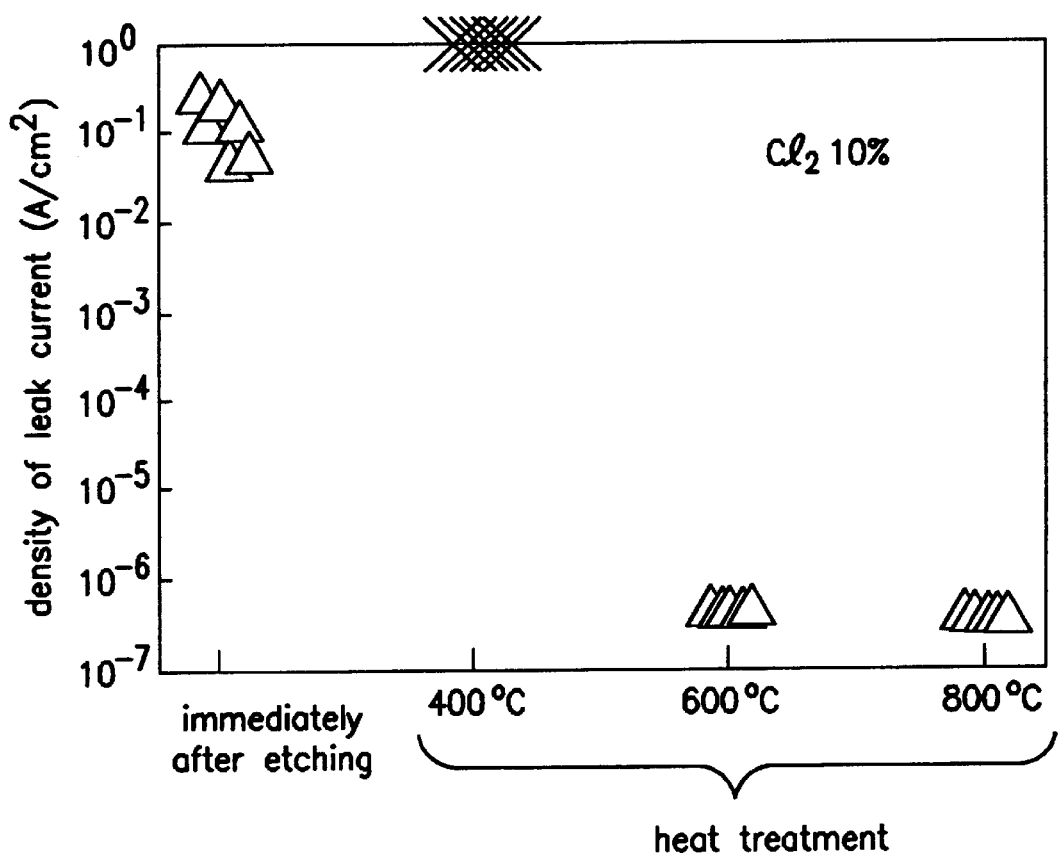
FIG. 4 is a diagram illustrative of measured densities of leak currents flowing through the dielectric layers in the capacitors applied with a voltage of 5V, wherein samples have been etched by a reactive ion etching, for example, an electron cyclotron resonance plasma etching using a reactive gas of 10%-$Cl_2$ mixed with Ar but subjected to no heat treatment thereafter and subjected to heat treatments at various temperatures.

FIG. 4 is a diagram illustrative of measured densities of leak currents flowing through the dielectric layers in the capacitors applied with a voltage of 5V, wherein some samples have been etched by a reactive ion etching, for example, the electron cyclotron resonance plasma etching by use of 10%-$Cl_2$ with Ar reactive gases but subjected to no heat treatment thereafter, another samples have been subjected to the reactive ion etching and subsequent heat treatment at 400° C. for 30 minutes in an oxygen atmosphere, still another samples have been subjected to the reactive ion etching and subsequent heat treatment at 600° C. for 30 minutes in an oxygen atmosphere, and yet another samples have been subjected to the reactive ion etching and subsequent heat treatment at 800° C. for 30 minutes in an oxygen atmosphere. It can be understood from FIG. 4 that the density of leak current flowing through the dielectric layer in the capacitor immediately after the reactive ion etching process but before the heat treatment is apparently lower than 1 $A/cm^2$. The density of leak current flowing through the dielectric layer in the capacitor after the heat treatment at 400° C. is higher than 1 $A/cm^2$. This means that the heat treatment at 400° C. causes almost no recovery of damage of the dielectric layer so that a short circuit is substantially formed through the dielectric layer between the top and bottom electrodes whereby the capacitor is unavailable. The density of leak current flowing through the dielectric layer in the capacitor after the heat treatment at 600° C. is lower than $1 \times 10^{-6}$ $A/cm^2$. This means that the heat treatment at 600° C. causes almost perfect recovery of damage of the dielectric layer so that the density of the leak current is remarkable dropped, whereby the capacitor is available and allowed to exhibit good properties. The density of leak current flowing through the dielectric layer in the capacitor after the heat treatment at 800° C. is also lower than $1 \times 10^{-6}$ $A/cm^2$. This means that the heat treatment at 800° C. causes almost perfect recovery of damage of the dielectric layer so that tie density of the leak current is remarkable dropped, whereby the capacitor is available and allowed to exhibit good properties. The above experimental results demonstrate that a temperature of 600° C. for the heat treatment is sufficient for causing the required almost complete recovery of damage of the dielectric layer and the required remarkable drop of the density of the leak current. Such relatively low temperature heat treatment may provide no substantial influence to semiconductor devices having been integrated in a substrate over which the capacitor is formed.

Figure 5:
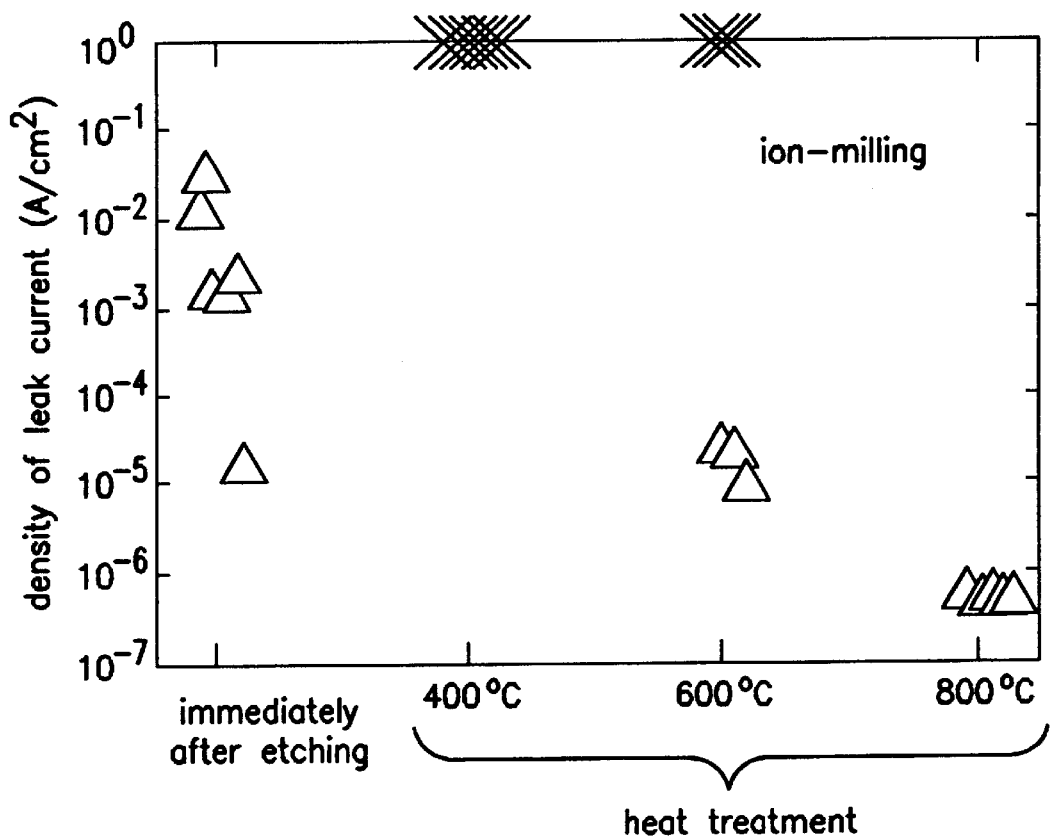
FIG. 5 is a diagram illusive of measured densities of leak currents flowing through the dielectric layers in the capacitors applied with a voltage of 5V, wherein samples have been etched by an ion-milling but subjected to no heat treatment thereafter and subjected to heat treatments at various temperatures.

FIG. 5 is a diagram illustrative of measured densities of leak currents flowing through the dielectric layers in the capacitors applied with a voltage of 5V, wherein some samples have been etched by an ion-milling but subjected to no heat treatment thereafter, another samples have been subjected to the ion-milling and subsequent heat treatment at 400° C. for 30 minutes in an oxygen atmosphere, still another samples have been subjected to the ion-milling and subsequent heat treatment at 600° C. for 30 minutes in an oxygen atmosphere, and yet another samples have been subjected to the ion-milling and subsequent heat treatment at 800° C. for 30 minutes in an oxygen atmosphere. It can be understood from FIG. 5 that the density of leak current flowing through the dielectric layer in the capacitor immediately after the ion-milling process but before the heat treatment is apparently lower than 1 $A/cm^2$. The density of leak current flowing through the dielectric layer in the capacitor after the heat treatment at 400° C. is much higher than 1 $A/cm^2$. This means that the heat treatment at 400° C. causes almost no recovery of damage of the dielectric layer so that a short circuit is substantially formed through the dielectric layer between the top and bottom electrodes whereby the capacitor is unavailable. The density of leak current flowing through the dielectric layer in the capacitor after the heat treatment at 600° C. is higher than $1 \times 10^{-5}$ $A/cm^2$. This means that the heat treatment at 600° C. causes insufficient recovery of damage of the dielectric layer so that the density of the leak current is insufficiently dropped whereby the capacitor remains unavailable. The density of leak current flowing through the dielectric layer in the capacitor after the heat treatment at 800° C. is lower than $1 \times 10^{-6}$ $A/cm^2$. This means that the heat treatment at 800° C. causes almost perfect recovery of damage of the dielectric layer so that the density of the leak current is remarkable dropped, whereby the capacitor is available and allowed to exhibit good properties.

The above experimental results demonstrate that a temperature of 800° C. for the heat treatment is required for causing the required almost complete recovery of damage of the dielectric layer and the required remarkable drop of the density of the leak current. Such relatively high temperature heat treatment may provide certain substantial influences to semiconductor devices having been integrated in a substrate over which the capacitor is formed.

Figure 6:
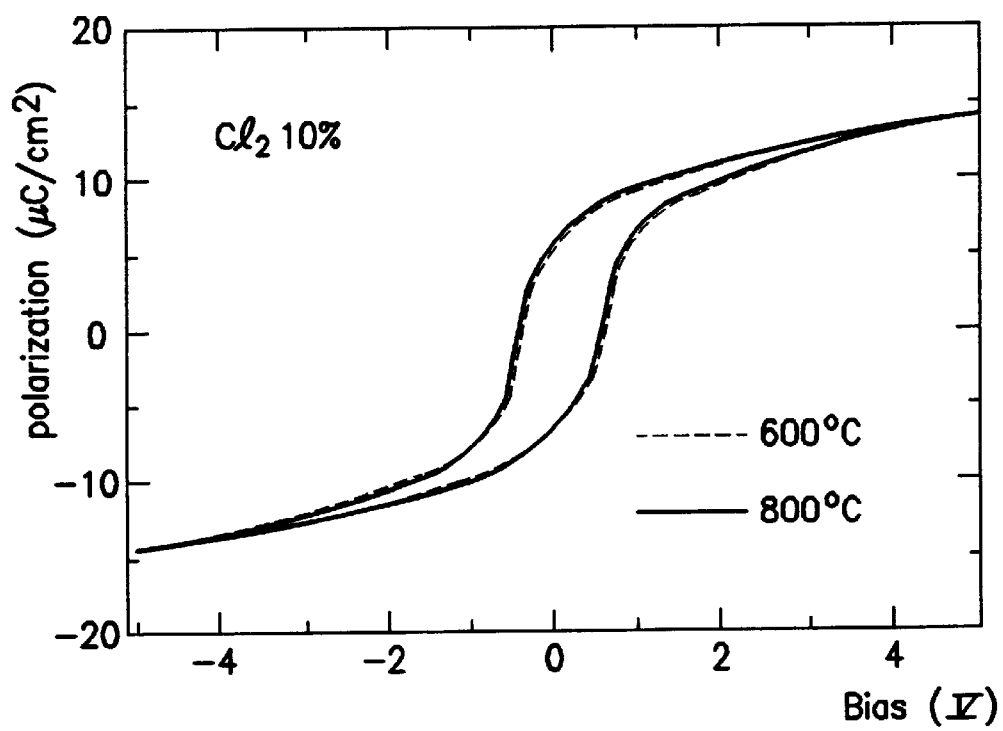
FIG. 6 is a graph illustrative of hysteresis loops of the capacitor which have been etched by the reactive ion etching, for example, the electron cyclotron resonance plasma etching with use of mixed reactive gases of 10%-$Cl_2$ with Ar and subsequently subjected to heat treatments at 600° C. and 800° C.

FIG. 6 is a graph illustrative of hysteresis loops of the capacitor which have been etched by the reactive ion etching, for example, the electron cyclotron resonance plasma etching with use of mixed reactive gases of 10%-$Cl_2$ with Ar and subsequently subjected to heat treatments at 600° C. and 800° C. A broken line represents the hysteresis loop when the heat treatment is carried out at 600° C., whilst a real line represents the hysteresis loop when the heat treatment is carried out at 800° C. The hysteresis loop when the heat treatment is carried out at 600° C. is almost the same as the hysteresis loop when the heat treatment is carried out at 800° C. Residual polarization values of the hysteresis loop when the heat treatment is carried out at 600° C. is almost the same as residual polarization values of the hysteresis loop when the heat treatment is carried out at 800° C. Those result show that the heat treatments at 600° C. and 800° C. provide the same effects, for which reason the heat treatment at 600° C. is sufficient for obtaining the required almost perfect recovery of damages of the dielectric layer but the heat treatment at 800° C. is not required.

For carrying out the reactive ion etching to the dielectric layer 3, in place of the above chlorine containing reactive gas, there are available $BCl_3$, $CBF_3$, a mixture of $BCl_3$ with Ar, and a mixture of $CHF_3$ with Ar. The ferrodielectric layer 3 is made of $SrBi_2TaO_9$ (SBT). The constitutional elements of $SrBi_2TaO_9$ (SBT), for example, Sr, Bi and Ta are reacted with Cl in $BCl_3$ thereby to form compounds of $SrCl_2$, $BCl_3$, $TaCl_5$ respectively. Those compounds $SrCl_2$, $BCl_3$, $TaCl_5$ have melting points which are not less than 20° C., for which reason those compounds are not evaporated but are sputtered by Ar ions which have been added. Coefficients of sputtering of those compounds are larger than that of the ferroelectric layer 3. If, for example, a concentration of $BCl_3$ to the mixture of $BCl_3$ with Ar is 10%, then the etching rate is 75 nanometers per a minute. If the mixture gases of $CHF_3$ with Ar are used, then almost the same etching rate can be obtained.

The use of those gases provides a great deal of improvement in productivity of the capacitor. Those mixed gases of $BCl_3$ with Ar and $CHF_3$ with Ar are reduction gases which are likely to provide relatively heavy damages to the dielectric layer 3, for which reason it is preferable to add oxygen at a concentration of about 10% to those gases in order to compensate the reduction reaction thereby weakening the damage to the dielectric layer 3, so that the relatively high temperature heat treatment at 800° C. is not required.

As described above, the top electrode layer and the dielectric layer are subjected to the reactive ion etching, for example, the electron cyclotron resonance plasma etching using the reactive gases but at different compositional ratios of chlorine to argon with changing the reactive gases. It is also possible that the top electrode layer and the dielectric layer are etched by the electron cyclotron resonance plasma etching using the reactive gases at the same compositional ratios of chlorine to argon without changing the reactive gases. This results in shortening the time for the etching processes to the top electrode layer and the dielectric layer, whereby the productivity of the capacitor is flier increased.

In the above embodiment, the above heat treatment after the reactive ion etching is carried out in the oxygen atmosphere. It is, however, possible that the heat treatment is carried out in a nitrogen atmosphere or in vacuum for recovery of damage, for example, crystal defects to the dielectric layer, even the effects of the recovery of the damage might slightly be smaller than when the heat treatment is carried out in the oxygen atmosphere.

With reference to FIG. 3I, the capacitor has been formed over the silicon dioxide film 1 in the above novel method.

With reference to FIG. 3J, an inter-layer insulator 11 is entirely formed over the capacitor and over the silicon dioxide film 1 by a chemical vapor deposition method.

With reference to FIG. 3K, a photo-resist film 12 is formed over the inter-layer insulator 11 by use of a photo-lithography. The photo-resist film 12 has an opening which is positioned over the top electrode 4 of the capacitor.

Figure 3L:
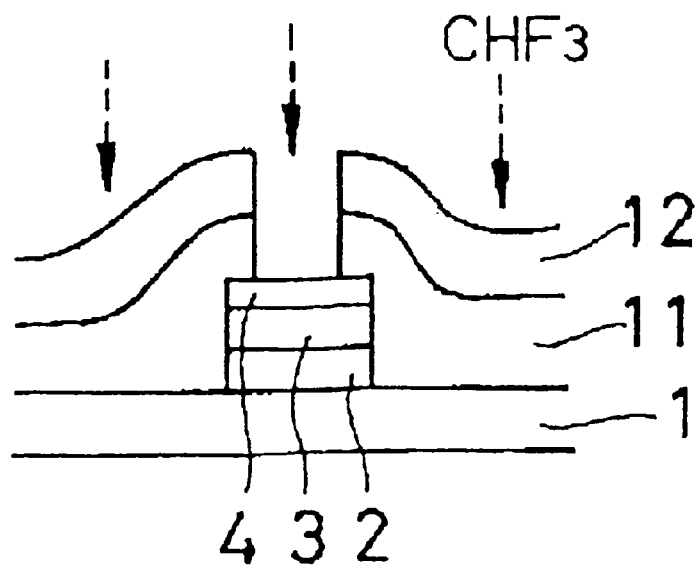
Figure 3M:
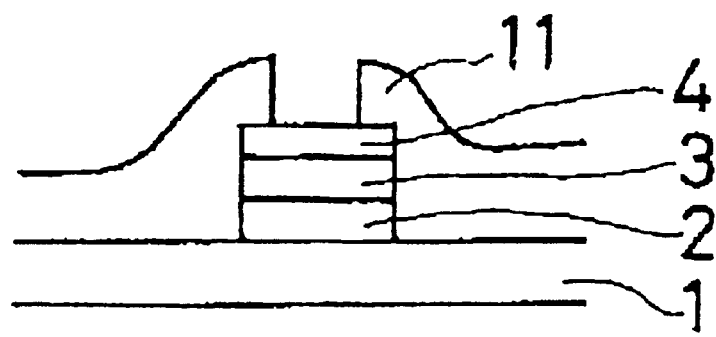

With reference to FIG. 3L, the inter-layer insulator 11 is selectively etched by use of the photo-resist film 12 as a mask wherein an electron cyclotron resonance plasma etching is carried out using a reactive gas of $CHF_3$. An etching rate of the electron cyclotron resonance plasma etching is 500 nanometers per a minute. As a result of the electron cyclotron resonance plasma etching, a contact hole is formed in the inter-layer insulator 11 so that the contact hole is positioned over the top electrode 4 of the capacitor. A part of the top electrode 4 of the capacitor is shown through the contact hole.

With reference to FIG. 3K the used photo-resist film 12 is removed by use of an organic solvent such as acetone.

Figure 3N:
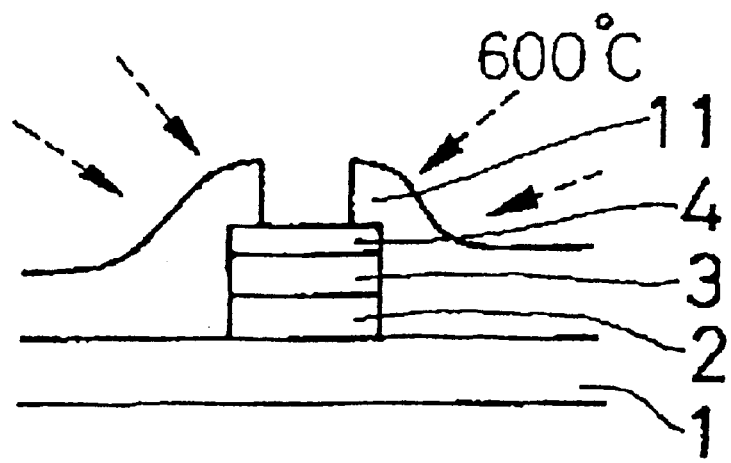

With reference to FIG. 3N, a heat treatment is carried out at a temperature of 600° C. for 30 minutes in an oxygen atmosphere.

Figure 3O:
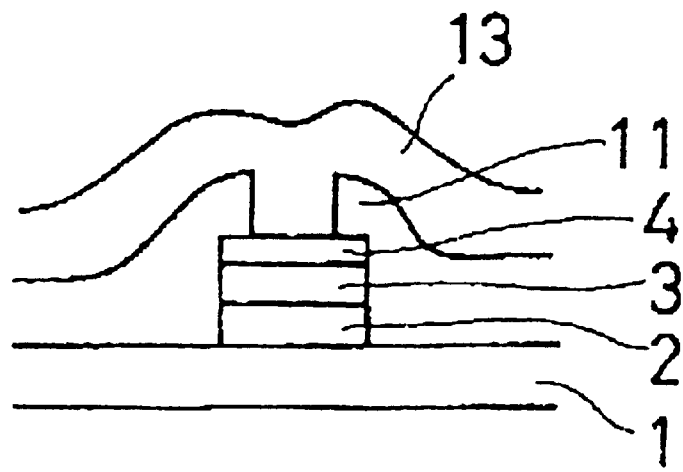

With reference to FIG. 3O, an interconnection layer 13 is entirely formed which extends over the inter-layer insulator 11 and also over the top electrode 4 under the contact hole so that the interconnection layer 13 is made into contact with the top electrode 4 of the capacitor. The interconnection layer 13 comprises laminations of a titanium layer, a titanium nitride layer and an aluminum layer. The titanium layer extends over the inter-layer insulator 11 and also over the top electrode 4 under the contact hole. The titanium nitride layer is formed which extends over the titanium layer. The aluminum layer is formed which extends over the titanium nitride layer.

Figure 3P:
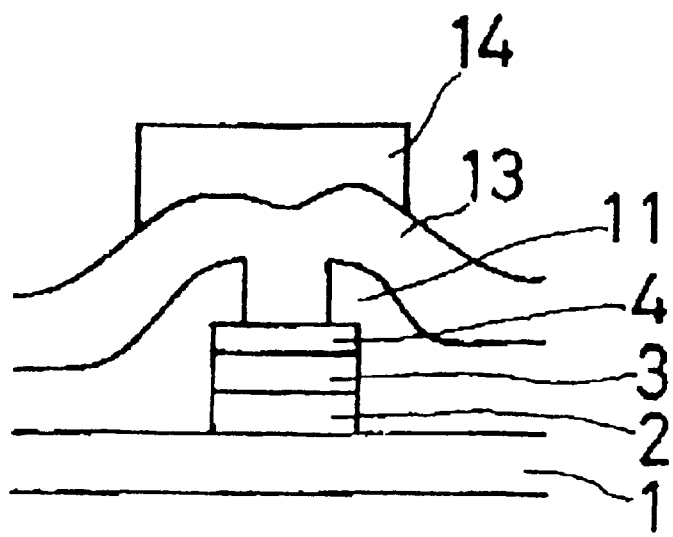

With reference to FIG. 3P, a photo-resist film 14 is selectively formed over the interconnection layer 13 by use of a photo-lithography.

Figure 3Q:
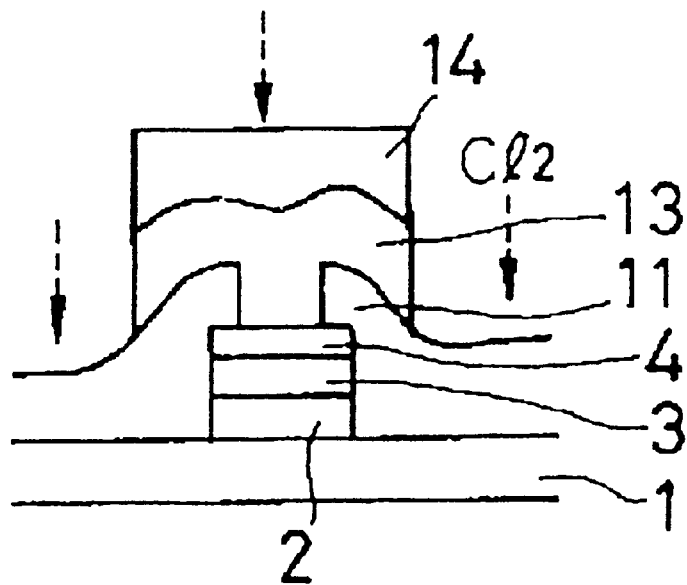

With reference to FIG. 3Q, the interconnection layer 13 is selectively etched by an electron cyclotron resonance plasma etching with use of the photo-resist film 14 as a mask, wherein $Cl_2$ is used as a reactive gas.

Figure 3R:
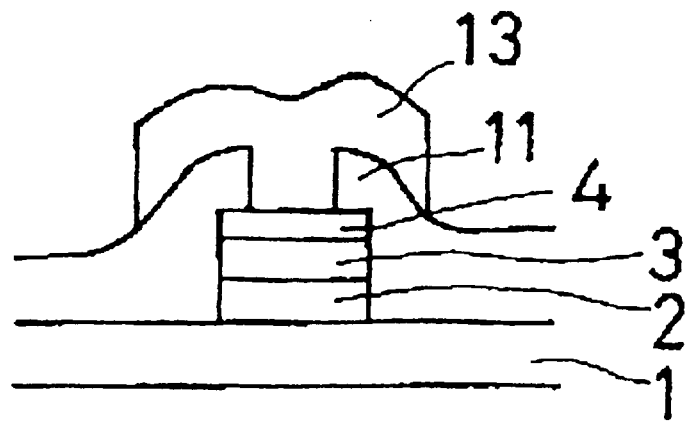

With reference to FIG. 3R, the used photo-resist film 14 is removed.

Figure 3S:
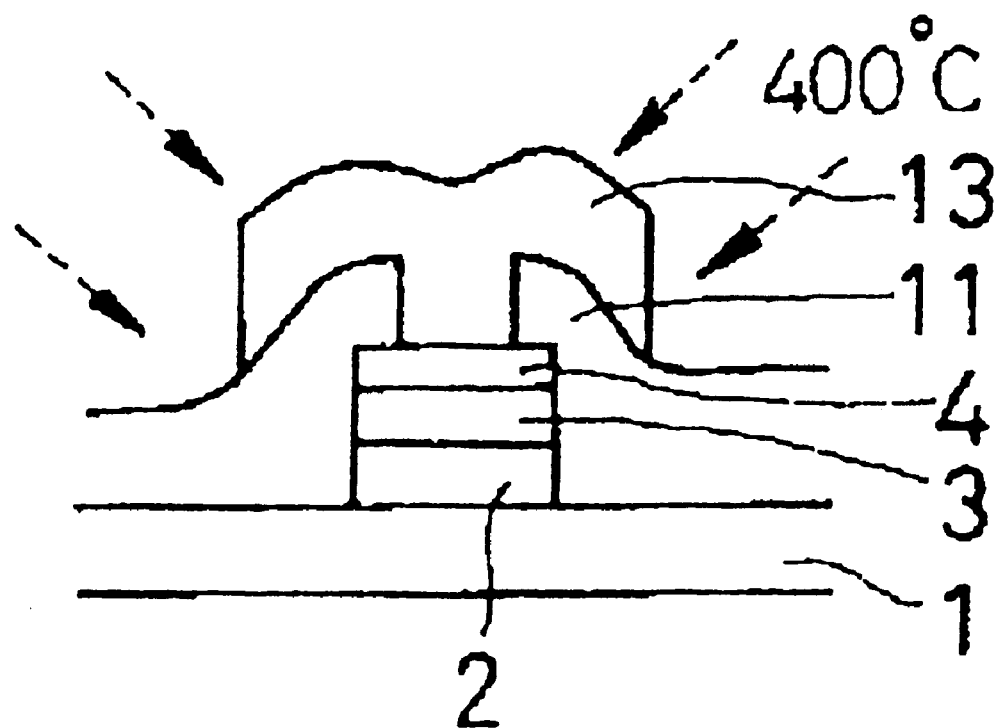

With reference to FIG. 3S, a heat treatment is carried out at a temperature of 400° C. for 30 minutes in a nitrogen atmosphere. The nitrogen atmosphere is used in place of the oxygen atmosphere for preventing oxidation of the interconnection layer 13.

Figure 7:
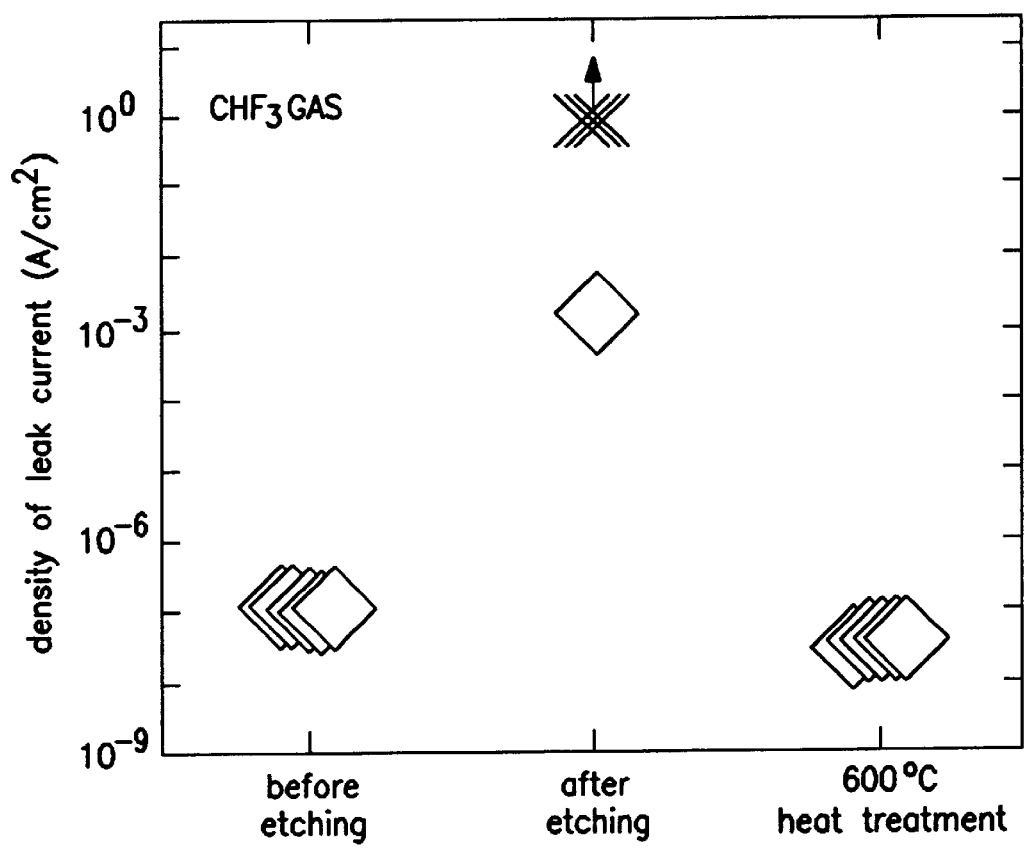
FIG. 7 is a diagram illustrative of measured densities of leak currents flowing through the dielectric layers in the capacitors applied with a voltage of 3V, wherein some samples have not yet been subjected to a reactive ion etching and also not yet subjected to a heat treatment thereafter, another samples have been subjected to a reactive ion etching, for example, the electron cyclotron resonance plasma etching by use of a $CHF_3$ reactive gas but not yet subjected to a heat treatment, still another samples have been subjected to the reactive ion etching, for example, the electron cyclotron resonance plasma etching by use of a $CHF_3$ reactive gas and subsequent heat treatment at 600° C. for 30 minutes in an oxygen atmosphere.

FIG. 7 is a diagram illustrative of measured densities of leak currents flowing through the dielectric layers in the capacitors applied with a voltage of 3V, wherein some samples have not yet been subjected to a reactive ion etching and also not yet subjected to a heat treatment thereafter, another samples have been subjected to a reactive ion etching, for example, the electron cyclotron resonance plasma etching by use of a $CHF_3$ reactive gas but not yet subjected to a heat treatment, still another samples have been subjected to the reactive ion etching, for example, the electron cyclotron resonance plasma etching by use of a $CHF_3$ reactive gas and subsequent heat treatment at 600° C. for 30 minutes in an oxygen atmosphere. It can be understood from FIG. 7 that the density of leak current flowing through the dielectric layer in the capacitor before the heat treatment is low, for example, about $1\times10^{-7} A/cm^2$. The density of leak current flowing through the dielectric layer in the capacitor immediately after the reactive ion etching process but before the heat treatment is apparently increased up to $1 A/cm^2$. The density of leak current flowing through the dielectric layer in the capacitor after the heat treatment at 600° C. is largely dropped to apparently lower than $1\times10^{-7} A/cm^2$. This means that the heat treatment at 600° C. causes almost perfect recovery of damage of the dielectric layer so that the density of the leak current is remarkably dropped, whereby the capacitor is available and allowed to exhibit good properties. The above experimental results demonstrate that a temperature of 600° C. for the heat treatment is sufficient for causing the required almost complete recovery of damage of the dielectric layer and the required remarkable drop of the density of the leak current. Such relatively low temperature heat treatment may provide no substantial influence to semiconductor devices having been integrated in a substrate over which the capacitor is formed.

It is further preferable to add oxygen to the above reactive gas $CHF_3$ at about 10% in order to reduce the deterioration of the reducing reaction.

Figure 8:
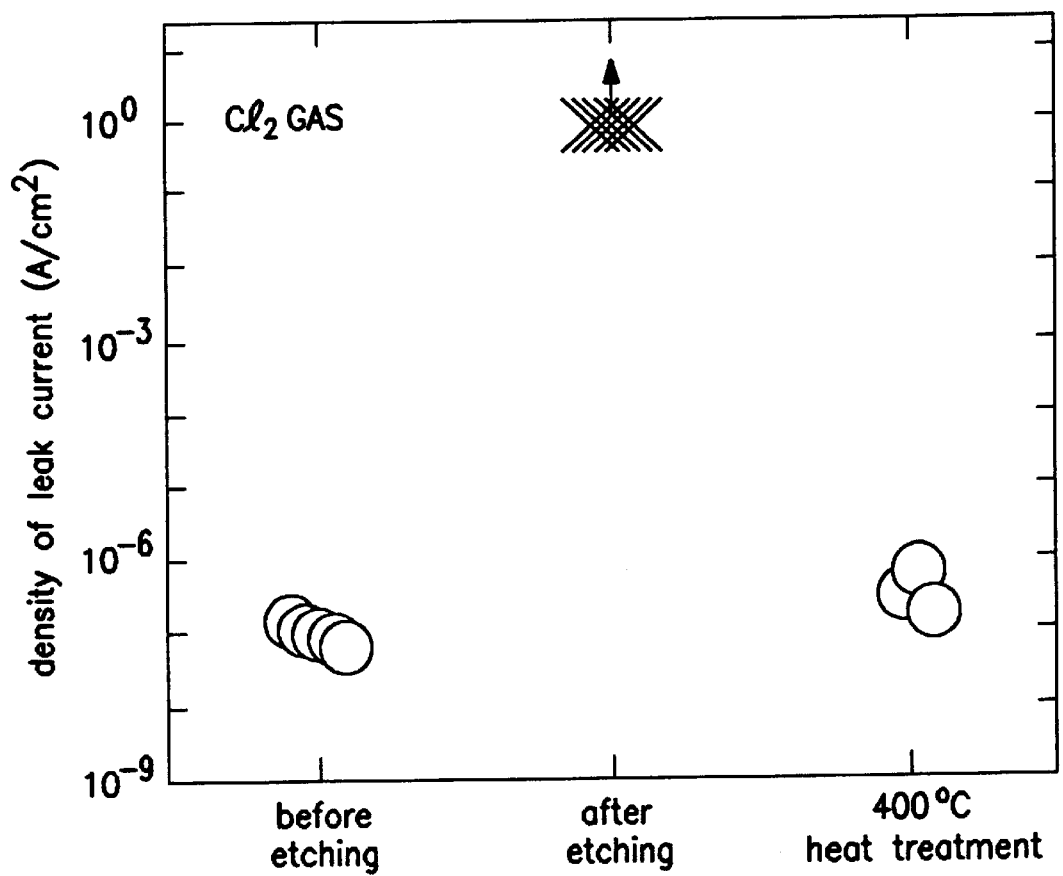
FIG. 8 is a diagram illustrative of measured densities of leak currents flowing through the dielectric layers in the capacitors applied with a voltage of 3V, wherein some samples have not yet been subjected to a reactive ion etching and also not yet subjected to a heat treatment thereafter, another samples have been subjected to a reactive ion etching, for example, the electron cyclotron resonance plasma etching by use of a $Cl_2$ reactive gas but not yet subjected to a heat treatment, still another samples have been subjected to the reactive ion etching, for example, the electron cyclotron resonance plasma etching by use of a $Cl_2$ reactive gas and subsequent heat treatment at 400° C. for 30 minutes in an oxygen atmosphere.

FIG. 8 is a diagram illustrative of measured densities of leak currents flowing through the dielectric layers in the capacitors applied with a voltage of 3V, wherein some samples have not yet been subjected to a reactive ion etching and also not yet subjected to a heat treatment thereafter, another samples have been subjected to a reactive ion etching, for example, the electron cyclotron resonance plasma etching by use of a $Cl_2$ reactive gas but not yet subjected to a heat treatment, still another samples have been subjected to the reactive ion etching, for example, the electron cyclotron resonance plasma etching by use of a $Cl_2$ reactive gas and subsequent heat treatment at 400° for 30 minutes in an oxygen atmosphere. It can be understood from FIG. 8 that the density of leak current flowing through the dielectric layer in the capacitor before the heat treatment is low, for example, about $1 \times 10^{-7}$ $A/cm^2$. The density of leak current flowing through the dielectric layer in the capacitor immediately after the reactive ion etching process but before the heat treatment is apparently increased up to over 1 $A/cm^2$. The density of leak current flowing through the dielectric layer in the capacitor after the heat treatment at 400° C. is largely dropped to apparently lower than $1 \times 10^{-6}$ $A/cm^2$. This means that the heat treatment at 400° C. causes sufficient recovery of damage of the dielectric layer so that the density of the leak current is remarkably dropped, whereby the capacitor is available and allowed to exhibit good properties. The above experimental results demonstrate that a temperature of 400° C. for the heat treatment is sufficient for causing the required sufficient recovery of damage of the dielectric layer and the required remarkable drop of the density of the leak current. Such relatively low temperature heat treatment may provide no substantial influence to semiconductor devices having been integrated in a substrate over which the capacitor is formed.

Figure 9:
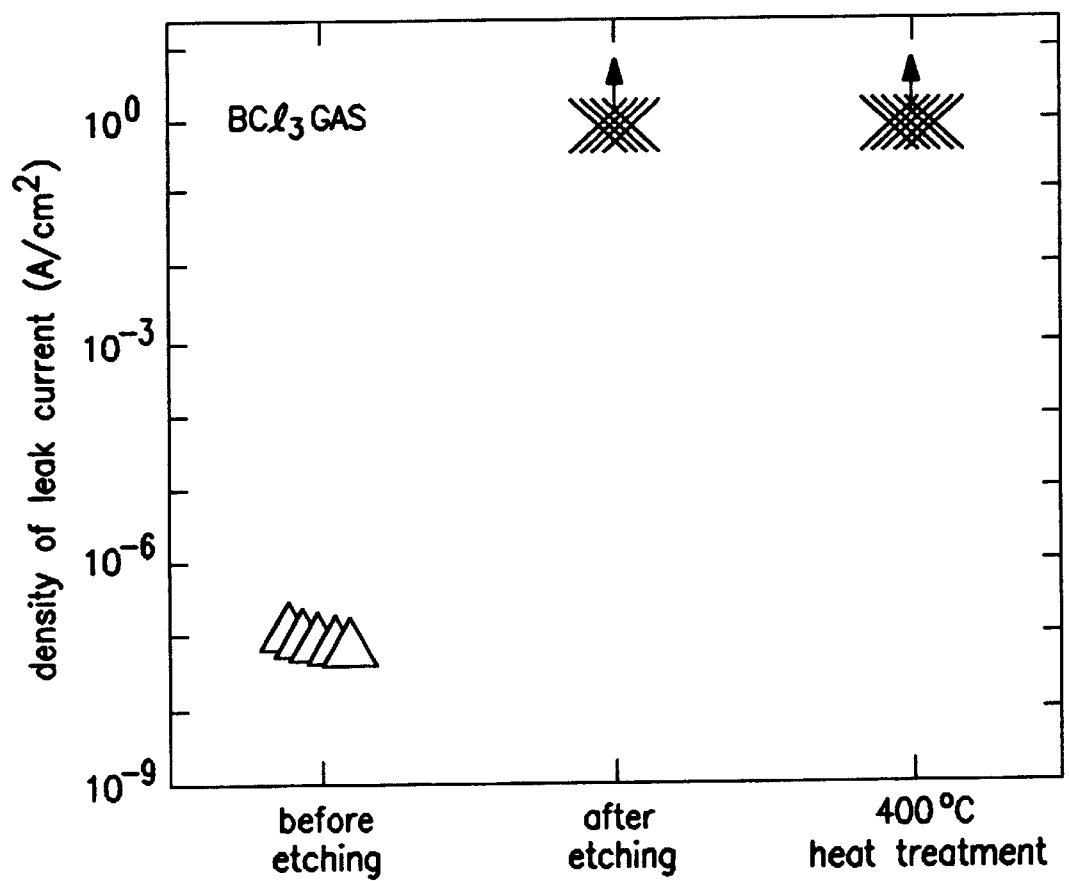
FIG. 9 is a diagram illustrative of measured densities of leak currents flowing through the dielectric layers in the capacitors applied with a voltage of 3V wherein some samples have not yet been subjected to a reactive ion etching and also not yet subjected to a heat treatment thereafter, another samples have been subjected to a reactive ion etching, for example, the electron cyclotron resonance plasma etching by use of a $BCl_3$ reactive gas but not yet subjected to a heat treatment, still another samples have been subjected to the reactive ion etching, for example, the electron cyclotron resonance plasma etching by use of the $BCl_3$ reactive gas and subsequent heat treatment at 400° C. for 30 minutes in an oxygen atmosphere.

FIG. 9 is a diagram illusive of measured densities of leak currents flowing through the dielectric layers in the capacitors applied with a voltage of 3V, wherein some samples have not yet been subjected to a reactive ion etching and also not yet subjected to a heat treatment thereafter, another samples have been subjected to a reactive ion etching, for example, the electron cyclotron resonance plasma etching by use of a $BCl_3$ reactive gas but not yet subjected to a heat treatment, still another samples have been subjected to the reactive ion etching, for example, the electron cyclotron resonance plasma etching by use of the $BCl_3$ reactive gas and subsequent heat treatment at 400° C. for 30 minutes in an oxygen atmosphere. It can be understood from FIG. 9 that the density of leak current flowing through the dielectric layer in the capacitor before the heat treatment is low, for example, about $1 \times 10^{-7}$ $A/cm^2$. The density of leak current flowing through the dielectric layer in the capacitor immediately after the reactive ion etching process but before the heat treatment is apparently increased up to over 1 $A/cm^2$. The density of leak current flowing through the dielectric layer in the capacitor after the heat treatment at 400° C. remains over 1 $A/cm^2$. This means that the heat treatment at 400° C. causes almost no recovery of damage of the dielectric layer so that the density of the leak current remains high, whereby the capacitor is unavailable. The above experimental results demonstrate that a temperature of 400° C. for the heat treatment is insufficient for causing the required sufficient recovery of damage of the dielectric layer and the required remarkable drop of the density of the leak current.

If the heat treatment at 600° C. is carried out after the aluminum layer 13 has been formed, problems are risen with melting of aluminum and oxidation thereof. The density of the leak current immediately after the reactive ion etching has been carried out by use of the $Cl_2$ reactive gas is lower than the density of the leak current immediately after the reactive ion etching has been carried out by use of the $BCl_3$ reactive gas. If the capacitor has been subjected to the reactive ion etching by use of the $Cl_2$ reactive gas, then the density of the leak current of the capacitor immediately after the heat treatment has been carried out at 400° C. is greatly dropped to the original leak current density value before the reactive ion etching process. By contrast, if the capacitor has been subjected to the reactive ion etching by use of the $BCl_3$ reactive gas, then the density of the leak current of the capacitor immediately after the heat treatment has been carried out at 400° C. remains high near the increased leak current density value before the heat treatment.

Chlorine has no reduction property. Notwithstanding, if the dielectric layer 3 has been etched by the electron cyclotron resonance plasma etching using chlorine, then the dielectric layer 3 is deteriorated because hydrogen generated from the photo-resist 14 provides influences to the dielectric layer and also because charge up phenomenon in the plasma also provides influences to the dielectric layer 3. In this case, however, it is possible to suppress the reduction by adding oxygen to the reactive gas.

Whereas in the above first embodiment the dielectric layer is made of $SrBi_2TaO_9$ (SBT), then $Pb(Zr_xTi_{1-x})O_9$ is also available. Further, high dielectric materials such as $(Ba_xSr_{1-x})TiO_3$ are also available for dynamic random access memory devices. The use of the reactive ion etching to the dielectric layer 3 is effective to any dielectric materials which show deterioration by reduction with oxide materials.

The relatively low temperature heat treatment causes the required sufficient recovery of light damage of the dielectric layer having received from the reactive ion etching.

The above reactive ion etching, for example, the electron cyclotron resonance plasma etching would reduce the damage to the dielectric layer. This allows a subsequent low temperature heat treatment could cause complete recovery of the reduced damage of the dielectric layer, whereby the capacitor having the dielectric layer is allowed to show excellent performances.

SECOND EMBODIMENT

A second embodiment according to the present invention will be described in detail with reference to FIGS. 10A through 10V which are fragmentary cross sectional elevation views illustrative of a novel method of forming a semiconductor memory device having a capacitor including a dielectric film of a high dielectric constant.

Figure 10A:
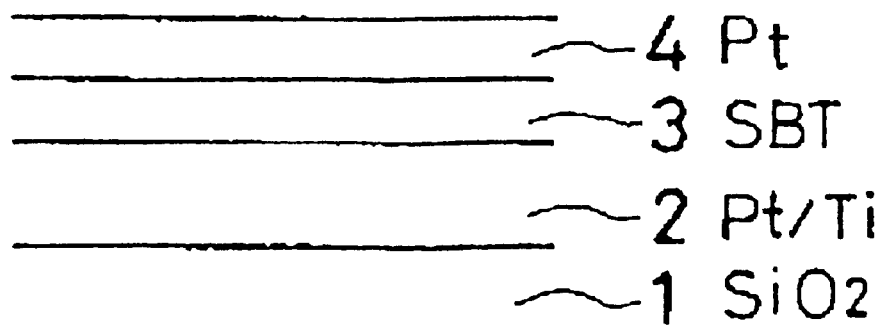
FIGS. 10A through 10V are fragmentary cross sectional elevation views illustrative of a novel method of forming a semiconductor memory device having a capacitor including a dielectric film of a high dielectric constant in a first embodiment in accordance with the present invention.

With reference to FIG. 10A, a bottom electrode layer 2 is formed on a silicon dioxide layer 1. The bottom electrode layer 2 comprises laminations of a platinum layer and a titanium layer. A ferroelectric layer 3 made of $SrBi_2Ta_2O_9$ (hereinafter referred to as SBT) is formed on the bottom electrode layer 2. A top electrode 4 of platinum is formed over the ferroelectric layer 3.

Figure 10B:
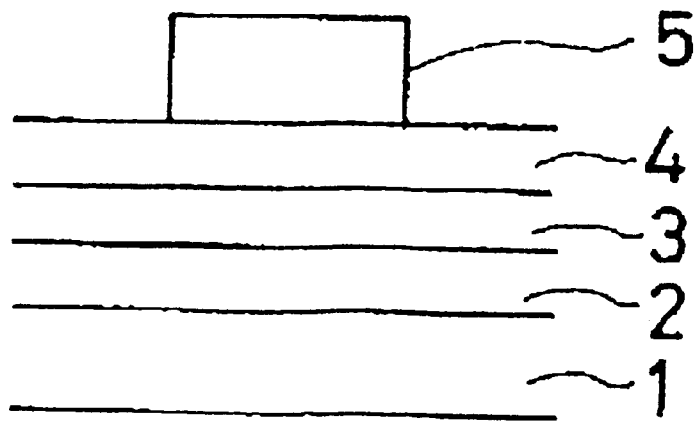

With reference to FIG. 10B, a photo-resist film 5 is selectively formed on a top surface of the top electrode layer 4.

Figure 10C:
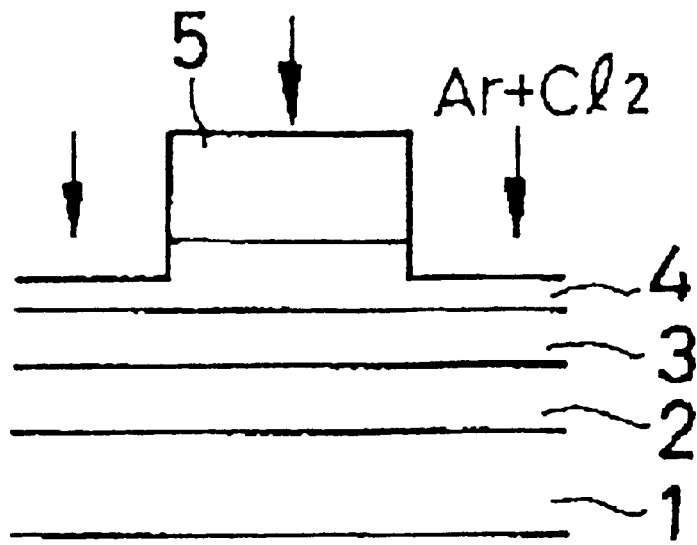

With reference to FIG. 10C, an electron cyclotron resonance plasma etching is carried out by use of a mixture gas of $Cl_2$ and Ar at a first compositional ratio as a reaction gas and by use of the photo-resist film 5 as a mask to selectively etch the top electrode layer 4. The first ratio of $Cl_2$ to Ar is so determined that a concentration of $Cl_2$ is about 20% or a concentration of Ar is 80%.

Figure 10D:
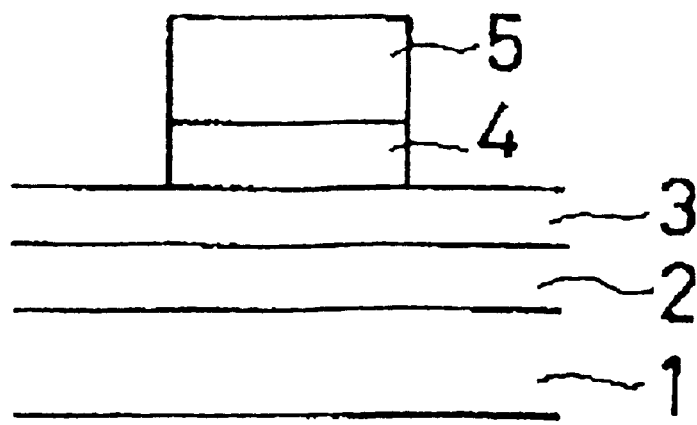

With reference to FIG. 10D, the top electrode 4 is defined which has the same size as the photo-resist 5.

Figure 10E:
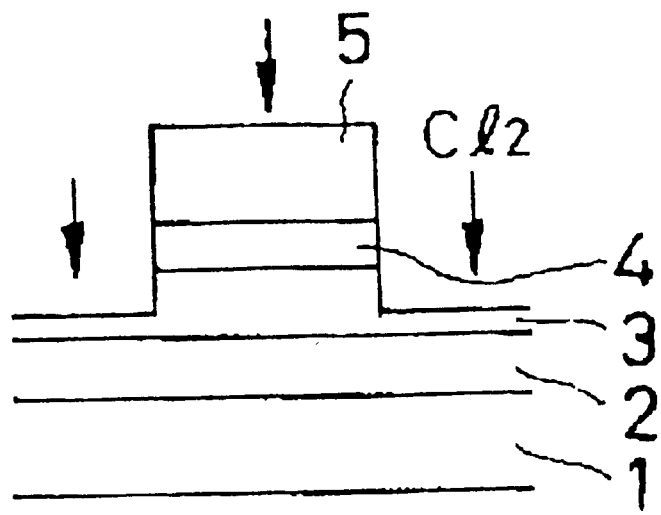

With reference to FIG. 10E, following to the above electron cyclotron resonance plasma etching, a further electron cyclotron resonance plasma etching is carried out by use of a mixture gas of $Cl_2$ and Ar at a second compositional ratio as a reaction gas and by use of the photo-resist film 5 as a mask to selectively etch the ferrodielectric layer 3. The second ratio of $Cl_2$ to Ar is so determined that a concentration of $Cl_2$ is about 10%. In the further electron cyclotron resonance plasma etching, the substrate may be heated or cooled. The ferroelectric layer 3 is made of $SrBi_2TaO_9$ (SBT). The constitutional elements of $SrBi_2TaO_9$ (SBT), for example, Sr, Bi and Ta are reacted with Cl thereby to form compounds of $SrCl_2$, $BiCl_3$, $TaCl_5$ respectively. Those compounds $SrCl_2$, $BiCl_3$, $TaCl_5$ have melting points which are not less than 20° C., for which reason those compounds are not evaporated but are sputtered by Ar ions which have been added. Coefficients of sputtering of those compounds are larger than that of the ferroelectric layer 3. It was experimentally confirmed that if the ferroelectric layer 3 is etched by the ion-milling method, then an etching rate is about 12 nanometers, whilst if the ferroelectric layer 3 is etched by the electron cyclotron resonance plasma etching method using the above mixed gases of chlorine and argon, then the etching rate is 46 nanometers.

Figure 10F:
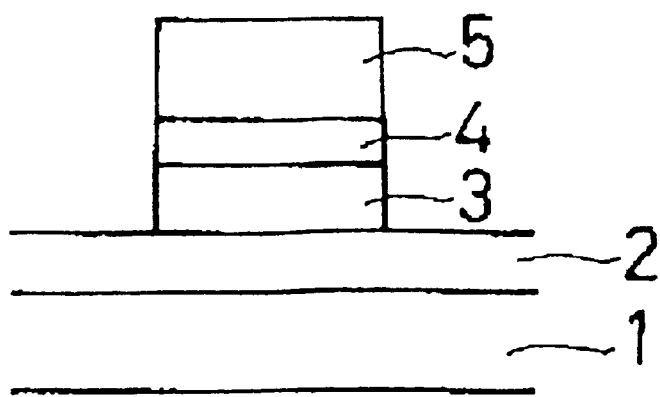

With reference to FIG. 10F, the ferrodielectric layer 3 is defined which has the same size as the photo-resist 5.

Figure 10G:
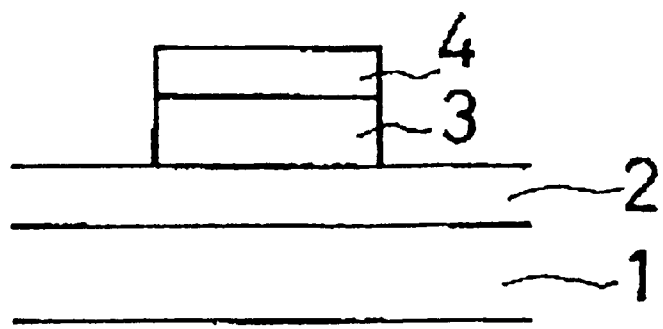

With reference to FIG. 10G, the used photo-resist 5 is removed by either ashing method of oxygen plasma or an organic solvent. By contrast, if the dielectric layer were etched by the ion-milling method, then the photo-resist film 5 is hardened whereby only the ashing method of oxygen plasma is available.

Figure 10H:
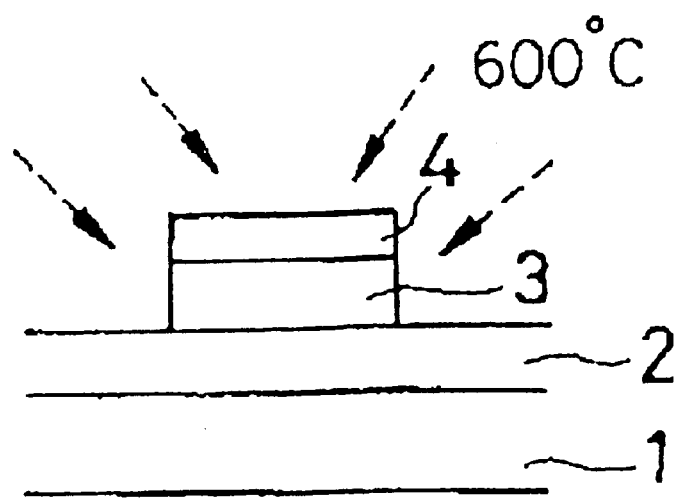

With reference to FIG. 10H, a heat treatment is carried out at a temperature of 600° C. for about 30 minutes in an oxygen atmosphere. As described above, the ferroelectric layer 3 receives no substantive damage in the reactive ion etching process but might receive a light damage. Such light damage of the ferroelectric layer 3 may be recovered by a relatively low temperature heat treatment, for example, not more than 600° C. in an oxygen atmosphere.

Figure 10I:
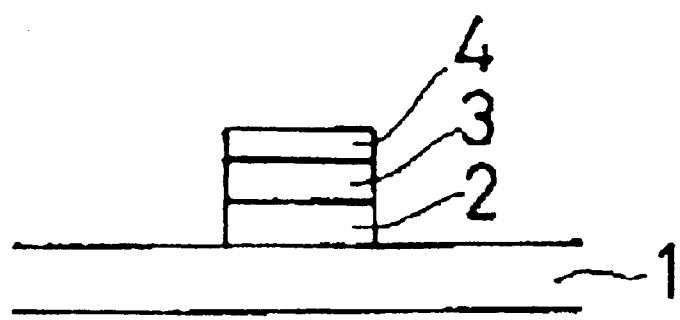
Figure 10J:
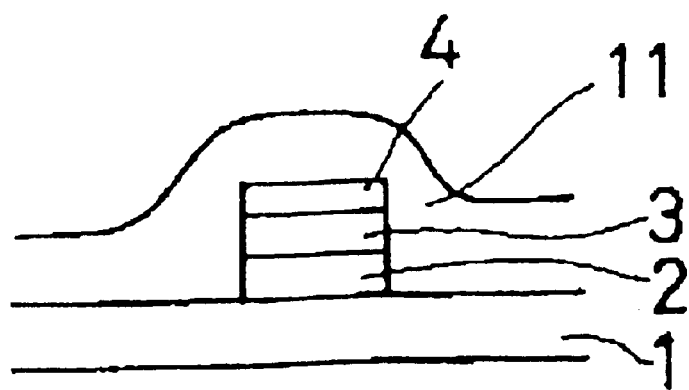

With reference to FIG. 10I, the capacitor has been formed over the silicon dioxide film 1 in the above novel method.

With reference to FIG. 10I, an inter-layer insulator 11 is entirely formed over the capacitor and over the silicon dioxide film 1 by a chemical vapor deposition method.

Figure 10K:
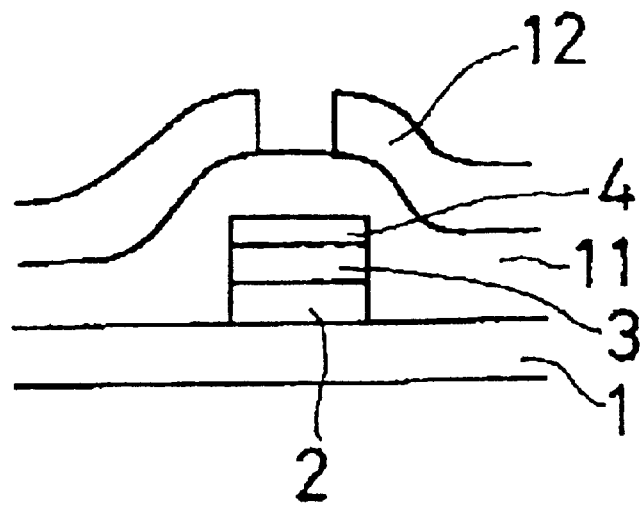

With reference to FIG. 10K, a photo-resist film 12 is formed over the inter-layer insulator 11 by use of a photo-lithography. The photo-resist film 12 has an opening which is positioned over the top electrode 4 of the capacitor.

Figure 10L:
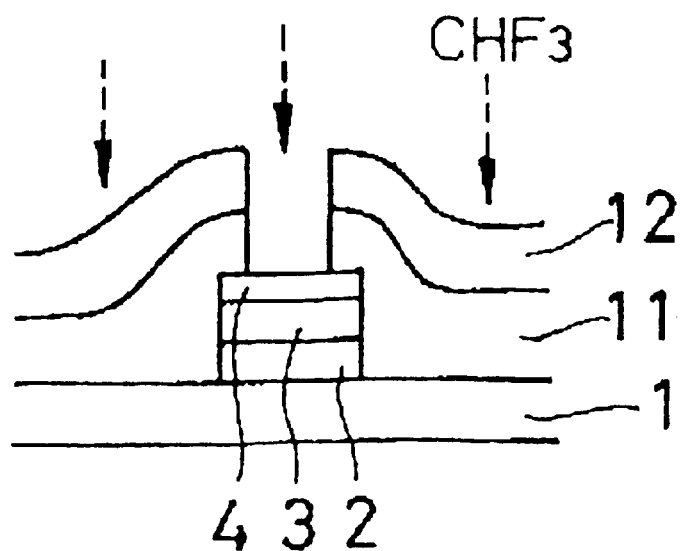

With reference to FIG. 10L, the inter-layer insulator 11 is selectively etched by use of the photo-resist film 12 as a mask wherein an electron cyclotron resonance plasma etching is carried out using a reactive gas of $CHF_3$. An etching rate of the electron cyclotron resonance plasma etching is 500 nanometers per a minute. As a result of the electron cyclotron resonance plasma etching, a contact hole is formed in the inter-layer insulator 11 so that the contact hole is positioned over the top electrode 4 of the capacitor. A part of the top electrode 4 of the capacitor is shown through the contact hole.

Figure 10M:
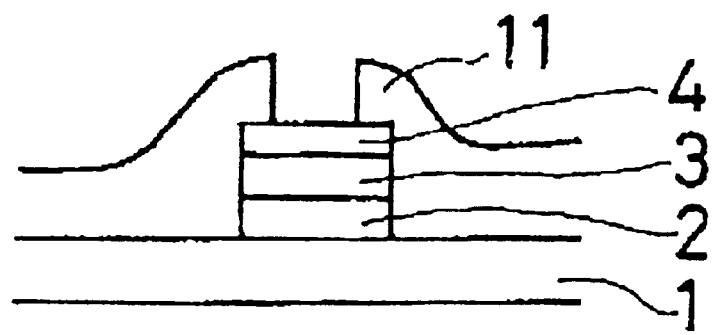

With reference to FIG. 10M, the used photo-resist film 12 is removed by use of an organic solvent such as acetone.

Figure 10N:
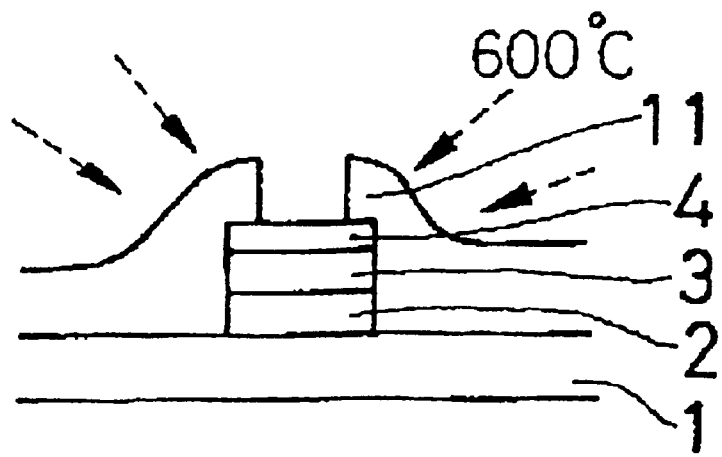

With reference to FIG. 10N, a heat treatment is carried out at a temperature of 600° C. for 30 minutes in an oxygen atmosphere.

Figure 10O:
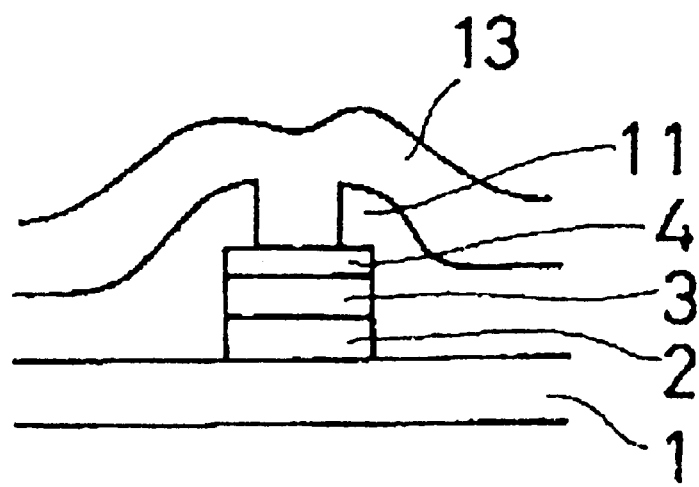

With reference to FIG. 10O, an interconnection layer 13 is entirely formed which extends over the inter-layer insulator 11 and also over the top electrode 4 under the contact hole so that the interconnection layer 13 is made into contact with the top electrode 4 of the capacitor. The interconnection layer 13 comprises laminations of a titanium layer, a titanium nitride layer and an aluminum layer. The titanium layer extends over the inter-layer insulator 11 and also over the top electrode 4 under the contact hole. The titanium nitride layer is formed which extends over the titanium layer. The aluminum layer is formed which extends over the titanium nitride layer.

Figure 10P:
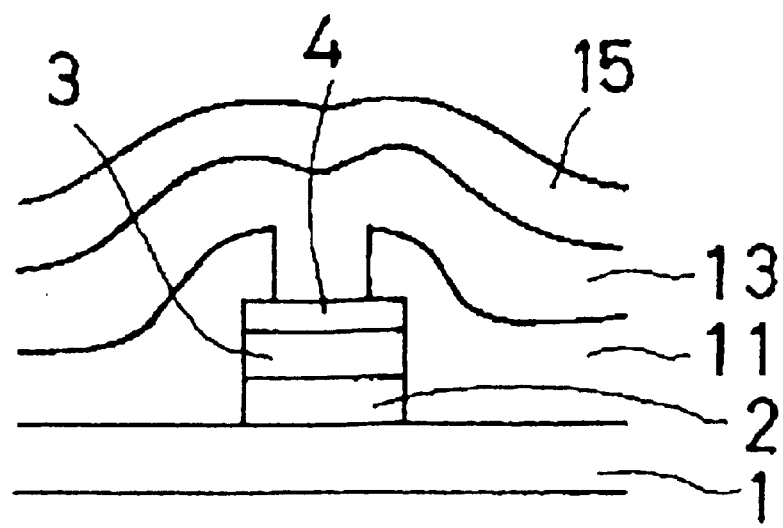

With reference to FIG. 10P, a non-doped silicon glass layer 15 having a thickness of 20 nanometers is formed over the interconnection layer 13 by a chemical vapor deposition method using tetraethoxysilane and $O_3$. In this case, $O_3$ provides a strong oxidation function which prevents deterioration by the reduction when the non-doped silicon glass layer 15 is grown. The non-doped silicon glass layer 15 may be grown a substrate temperature of 400° C. which cause no oxidation of the aluminum layer of the interconnection layer 13.

Figure 10Q:
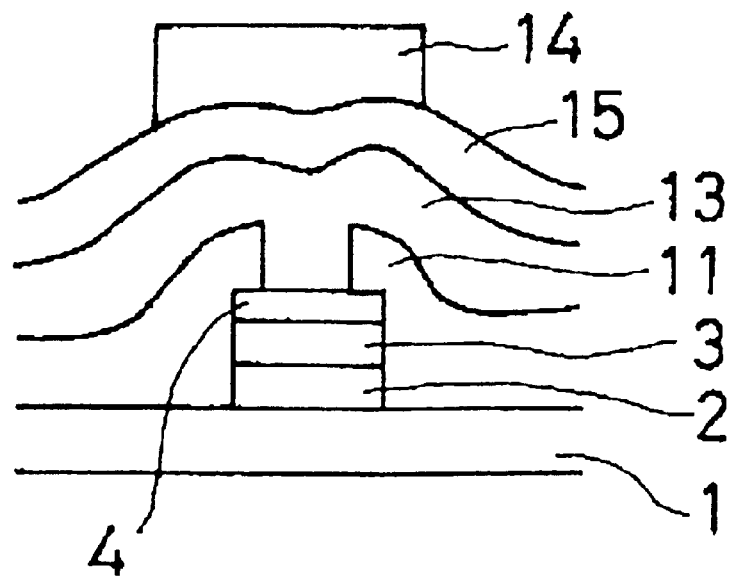

With reference to FIG. 10Q, a photo-resist film 14 is selectively formed over the non-doped silicon glass layer 15.

Figure 10R:
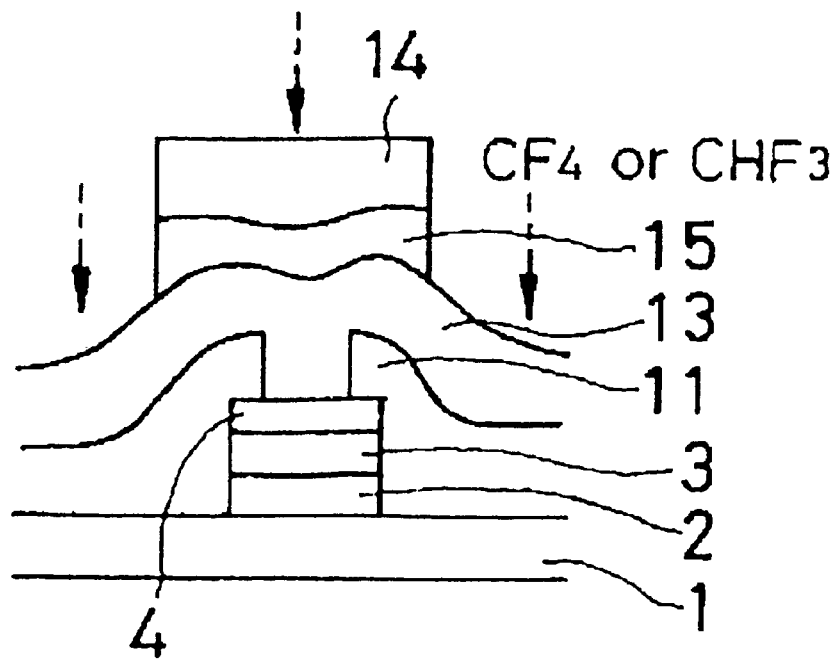

With reference to FIG. 10R, the non-doped silicon glass layer 15 is selectively etched by a reactive ion etching, for example, an electron cyclotron resonance plasma etching with use of a reactive gas of $CF_4$ or $CHF_3$. The non-doped silicon glass layer 15 receives almost no substantive damage from the electron cyclotron resonance plasma etching.

Figure 10S:
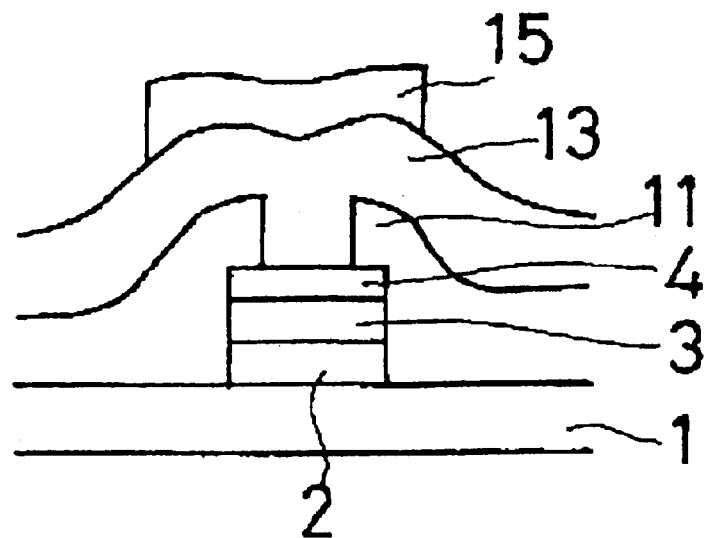

With reference to FIG. 10S, the used photo-resist film 14 is removed by an organic solvent such as acetone.

Figure 10T:
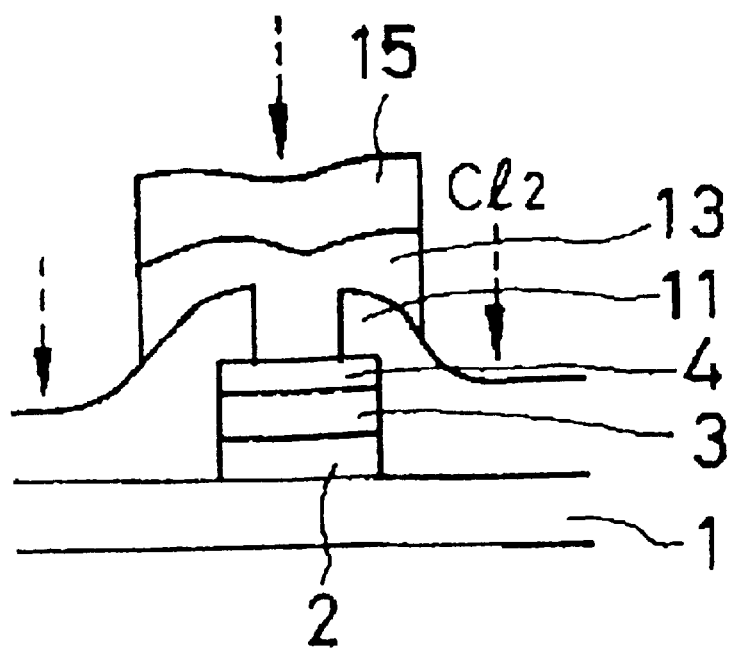

With reference to FIG. 10T, the interconnection layer 13 is selectively etched by a reactive ion etching, for example, an electron cyclotron resonance plasma etching with use of a reactive gas of $Cl_2$, wherein the non-doped silicon glass layer 15 is used as a mask. In this case, since the photo-resist film 14 had already been removed, no hydrogen is generated whereby no deterioration to the interconnection layer 13 is caused.

Figure 10U:
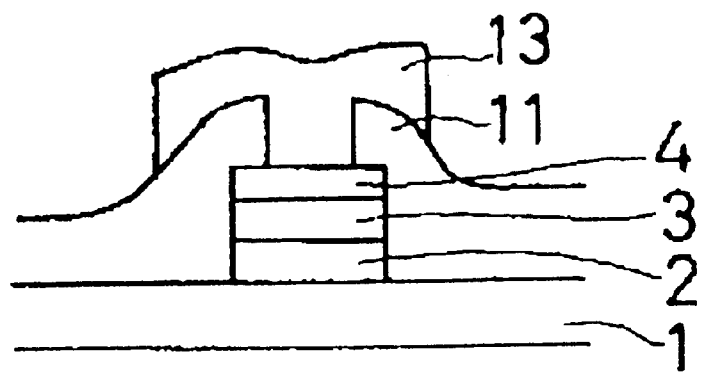

With reference to FIG. 10U, the used non-doped silicon glass layer 15 is removed by etching the same with use of reactive gas of $CF_4$ or $CHF_3$.

Figure 10V:
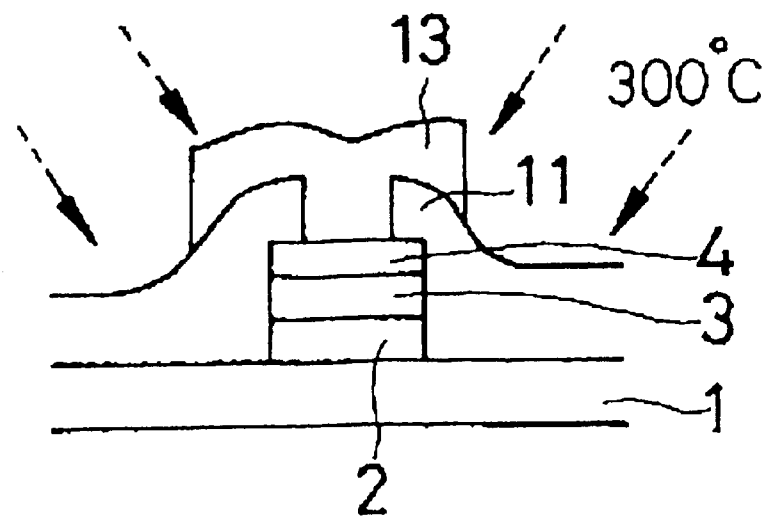

With reference to FIG. 10V, a heat treatment is carried oat at a temperature of 300° C. in the nitrogen atmosphere.

No deterioration by the reduction is caused in the above method. Notwithstanding, the interconnection layer receives a light damage due to charge up, for which reason such heat treatment is required for recovery of the damage. Since, however, the damage that the interconnection layer received would be light due to the reactive ion etching, for example, the electron cyclotron resonance plasma etching, then such the low temperature heat treatment at about 300° C. causes almost exact recovery of the damage of the interconnection layer 13. Even if no heat treatment is carried out, then a small leakage of current is caused, which might be allowable low current density level.

Since the non-doped silicon glass layer 15 protects the dielectric layer 3 from hydrogen generated from the photo-resist 14, the dielectric layer 3 is completely free from the deterioration due to hydrogen. The capacitor having the dielectric layer 3 has a high durability.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of defining a dielectric layer of a capacitor in a manufacturing a semi-conductor device, said method comprising the steps of:

selectively etching said dielectric layer by a reactive ion etching with a mixture gas comprising Ar and $Cl_2$ so that said dielectric layer of said capacitor receives almost no substantive damage in said etching process;

forming an inter-layer insulator which covers said capacitor;

selectively etching said inter-layer insulator; and carrying out an inter-layer heat treatment at a temperature of not higher than 600° C.

2. The method as claimed in claim 1, wherein said dielectric layer is made of a dielectric material having a high dielectric constant.

3. The method as claimed in claim 2, wherein said dielectric martial is an oxide material which shows a deterioration by a reduction reaction.

4. The method as claimed in claim 2, wherein said dielectric martial is a ferroelectric material which shows a ferroelectric property.

5. The method as claimed in claim 4, wherein said ferroelectric material is $SrBi_2Ta_2O_9$.

6. The method as claimed in claim 4, wherein said ferroelectric material is $Pb(Zr_xTi_{1-x})O_3$.

7. The method as claimed in claim 3, wherein said ferroelectric material is $(Ba_xSr_{1-x})TiO_3$.

8. The method as claimed in claim 1, wherein a ratio of $Cl_2$ to said mixture gas is about 10%.

9. The method as claimed in claim 1, wherein said reactive ion etching is an electron cyclotron resonance plasma etching.

10. The method as claimed in claim 1, wherein said heat treatment is carried out in an oxygen atmosphere.

11. The method as claimed in claim 1, wherein said reactive ion etching is an electron cyclotron resonance etching.

12. The method of claim 1, wherein the mixture gas comprises Ar in 90% on and $Cl_2$ in 10% concentration.

13. The method as claimed in claim 1, further comprising the step of carrying out a heat treatment at a temperature of not higher than 600° C. prior to said step of forming an inter-lever insulator.

14. The method as claimed in claim 13, wherein said heat treatment is carried out in an oxygen atmosphere.

15. The method as claimed in claim 13, wherein said heat treatment is carried out in a nitrogen atmosphere.

16. The method as claimed in claim 13, wherein said heat treatment is carried out in vacuum.

17. The method as claimed in claim 1, further comprising the steps of:

forming a conductive layer over said insulation layer; and selectively etching said conductive layer by a reactive ion etching.

18. The method as claimed in claim 17, wherein said reactive ion etching is an electron cyclotron resonance plasma etching.

19. The method as claimed in claim 17, further comprising the steps of carrying out a heat treatment at a temperature of not higher than 400° C. after said conductive layer has been etched by said reactive ion etching.

20. The method as claimed in claim 19, wherein said heat treatment is carried out in a nitrogen atmosphere.

21. The method as claimed in claim 1, further comprising the steps of:

forming a conductive layer over said insulation layer;

forming a non-doped silicon glass layer over said conductive layer;

selectively etching said non-doped silicon glass layer to form a non-doped silicon glass mask over said conductive layer;

selectively etching said conductive layer by a reactive ion etching with use of said non-doped silicon glass mask; and removing said non-doped silicon glass mask.

22. The method as claimed in claim 19, wherein said non-doped silicon glass layer is selectively etched by use of a resist as a mask and by an electron cyclotron resonance plasma etching using $CF_4$ as an etching gas.

23. The method as claimed in claim 19, wherein said non-doped silicon glass layer is selectively etched by use of a resist as a mask and by an electron cyclotron resonance plasma etching using $CHF_3$ as an etching gas.

24. The method as claimed in claim 21, wherein said reactive ion etching to said conductive layer is carried out by use of an reactive gas including chlorine.

25. The method as claimed in claim 21, further comprising the step of carrying out a heat treatment at a temperature of about 300° C. in a nitrogen atmosphere after said non-doped silicon glass mask has been removed.

26. The method as claimed in claim 21, wherein said non-doped silicon glass layer is deposited by a chemical vapor deposition method at a temperature of not more than 400° C.

27. A method of forming a capacitor, comprising the steps of:

forming a dielectric layer over a bottom electrode layer;

forming a top electrode layer over said dielectric layer to form laminations of said bottom electrode layer, said dielectric layer and said top electrode layer;

selectively etching said laminations to form a capacitor;

wherein at least said dielectric layer is etched by a reactive ion etching of a mixture gas comprising Ar and $Cl_2$ so that said dielectric layer of said capacitor receives almost no substantive damage in said etching processes;

forming an insulation layer which covers said capacitor;

selectively etching said-insulation layer; and carrying out an insulation layer heat treatment at a temperature of not higher than 600° C.

28. The method as claimed in claim 27, wherein a ratio of the $Cl_2$ to said mixture gas is about 10%.

29. The method as claimed in claim 27, wherein said reactive ion etching is an electron cyclotron resonance plasma etching.

30. The method as claimed in claim 27, wherein the step of:

selectively etching said insulation layer is by a reactive ion etching.

31. The method as claimed in claim 27, wherein said reactive ion etching is an electron cyclotron resonance plasma etching.

32. The method as claimed in claim 27, wherein said capacitor is formed over an insulation film over a semiconductor substrate having a semiconductor integrated circuit.

33. The method as claimed in claim 27, wherein said capacitor is formed on a semiconductor substrate having a semiconductor integrated circuit.

34. The method as claimed in claim 27, wherein said top electrode layer is also etched by said reactive ion etching.

35. The method as claimed in claim 34, wherein said bottom electrode layer is also etched by said reactive ion etching.

36. The method as claimed in claim 27, wherein said dielectric layer is made of a dielectric material having a high dielectric constant.

37. The method as claimed in claim 36, wherein said dielectric martial is an oxide material which shows a deterioration by a reducton reaction.

38. The method as claimed in claim 36, wherein said dielectric martial shows non-ferroelectric property.

39. The method as claimed in claim 38, wherein said ferroelectric material is $(Ba_xSr_{1-x})TiO_3$.

40. The method as claimed in claim 36, wherein said dielectric martial is a ferroelectric material which shows a ferroelectric property.

41. The method as claimed in claim 40, wherein said ferroelectric material is $SrBi_2Ta_2O_9$.

42. The method as claimed in claim 40, wherein said ferroelectric material is $Pb(Zr_xTi_{1-x})O_3$.

43. The method as claimed in claim 27, further comprising the step of carrying out a heat treatment at a temperature of not higher that 600° C. after at least said dielectric layer has been etched by said reactive ion etching.

44. The method as claimed in claim 43, wherein said heat treatment is carried out in an oxygen atmosphere.

45. The method as claimed in claim 43, wherein said heat treatment is carried out in a nitrogen atmosphere.

46. The method as claimed in claim 43, wherein said heat treatment is carried out in vacuum.

47. The method of claim 27, wherein the mixture gas comprises Ar in 90% and $Cl_2$ in 10% concentration.

48. A method of forming a semiconductor memory device, comprising the steps of:
   forming a dielectric layer having a high dielectric constant over a bottom electrode layer;
   forming a top electrode layer over said dielectric layer to form laminations of said bottom electrode layer, said dielectric layer and said top electrode layer;
   selectively etching said laminations with a mixture gas comprising Ar and $Cl_2$ to form a capacitor;
   carrying out a first heat treatment at a temperature of not higher than 600° C. after at least said dielectric layer has been etched;
   forming an inter-layer insulator which covers said capacitor;
   selectively etching said inter-layer insulator;
   carrying out a second heat treatment at a temperature of not higher than 600° C. after said inter-layer insulator has been etched;
   forming am interconnection layer over said inter-layer insulator;
   selectively etching said interconnection layer; and
   carrying out a third heat treatment at a temperature of not higher than 400° C.;
   wherein at least said dielectric layer is etched by a reactive ion etching so that said dielectric layer of said capacitor receives almost no substantive damage in said etching process.

49. The method as claimed in claim 48, wherein said top electrode layer is also etched by said reactive ion etching.

50. The method as claimed in claim 49, wherein said bottom electrode layer is also etched by said reactive ion etching.

51. The method as claimed in claim 50, wherein said dielectric martial is a ferroelectric material which shows a ferroelectric property.

52. The method as claimed in claim 51, wherein said ferroelectric material is $SrBi_2Ta_2O_9$.

53. The method as claimed in claim 51, wherein said ferroelectric material is $Pb(Zr_xTi_{1-x})O_3$.

54. The method as claimed in claim 50, wherein said dielectric martial shows non-ferroelectric property.

55. The method as claimed in claim 54, wherein said ferroelectric material is $(Ba_xSr_{1-x})TiO_3$.

56. The method as claimed in claim 55, wherein said dielectric martial is an oxide material which shows a deterioration by a redaction reaction.

57. The method as claimed in claim 48, wherein a ratio of the $Cl_2$ to said mixture gas is about 10%.

58. The method as claimed in claim 48, wherein said reactive ion etching to said dielectric layer is an electron cyclotron resonance plasma etching.

59. The method as claimed in claim 48, wherein said first heat treatment is carried out in an oxygen atmosphere.

60. The method as claimed in claim 48, wherein said fi heat treatment is carried out in a nitrogen atmosphere.

61. The method as claimed in claim 48, wherein said first heat treatment is carried out in vacuum.

62. The method as claimed in claim 48, wherein said inter-layer insulator is also etched by a further reactive ion etching which is carried out by use of a reactive gas including $CHF_3$.

63. The method as claimed in claim 62, wherein oxygen is filer added to said reactive gas at about 10%.

64. The method as claimed in claim 62, wherein said further reactive ion etching is an electron cyclotron resonance plasma etching.

65. The method as claimed in claim 48, wherein said second heat treatment is carried out in an oxygen atmosphere.

66. The method as claimed in claim 48, wherein a ratio of the $O_2$ to said mixture gas is about 10%.

67. The method as claimed in claim 66, wherein said furthermore reactive ion etching is au electron cyclotron resonance plasma etching.

68. The method as claimed in claim 48, wherein said third heat treatment is carried out in a nitrogen atmosphere.

69. The method as claimed in claim 48, wherein said capacitor is formed over an insulation film over a semiconductor substrate having a semiconductor integrated circuit.

70. The method as claimed in claim 48, wherein said capacitor is formed on a semiconductor substrate having a semiconductor integrated circuit.

71. A method of forming a semiconductor memory device, comprising the steps of:
   forming a dielectric layer having a high dielectric constant over a bottom electrode layer;
   forming a top electrode layer over said dielectric layer to form laminations of said bottom electrode layer, said dielectric layer and said top electrode layer;
   selectively etching said laminations with a mixture gas comprising Ar and $Cl_2$ to form a capacitor;
   carrying out a first heat treatment at a temperature of not higher than 600° C. after at least said dielectric layer has been etched;

forming an inter-layer insulator which covers said capacitor;

selectively etching said inter-layer insulator;

carrying out a second heat treatment at a temperature of not higher than 600° C.;

forming an interconnection layer over said inter-layer insulator;

forming a non-doped silicon glass layer over said interconnection layer;

selectively etching said non-doped silicon glass layer to form a non-doped silicon glass mask over said interconnection layer;

selectively etching said interconnection layer by use of said non-doped silicon glass mask;

removing said non-doped silicon glass mask; and carrying out a third heat treatment at a temperature of about 300° C. in a nitrogen atmosphere;

wherein at least said dielectric layer is etched by a reactive ion etching so that said dielectric layer of said capacitor receives almost no substantive damage in said etching process.

72. The method as claimed in claim 71, wherein said top electrode layer is also etched by said reactive ion etching.

73. The method as claimed in claim 72, wherein said bottom electrode layer is also etched by said reactive ion etching.

74. The method as claimed in claim 73, wherein said dielectric martial is a ferroelectric material which shows a ferroelectric property.

75. The method as claimed in claim 74, wherein said ferroelectric material is $SrBi_2Ta_2O_9$.

76. The method as claimed in claim 74, wherein said ferroelectric material is $Pb(Zr_xTi_{1-x})O_3$.

77. The method as claimed in claim 73, wherein said dielectric martial shows non-ferroelectric property.

78. The method as claimed in claim 77, wherein said ferroelectric material is $(Ba_xSr_{1-x})TiO_3$.

79. The method as claimed in claim 78, wherein said dielectric martial is an oxide material which shows a deterioration by a reduction reaction.

80. The method as claimed in claim 71, wherein a ratio of the $Cl_2$ to said mixture gas is about 10%.

81. The method as claimed in claim 71, wherein a ratio of the $O_2$ to said mixture gas is about 10%.

82. The method as claimed in claim 71, wherein said reactive ion etching to said dielectric layer is an electron cyclotron resonance plasma etching.

83. The method as claimed in claim 71, wherein said it heat treatment is carried out in an oxygen atmosphere.

84. The method as claimed in claim 71, wherein said first heat treatment is carried out in a nitrogen atmosphere.

85. The method as claimed in claim 71, wherein said first heat treatment is carried out in vacuum.

86. The method as claimed in claim 71, wherein said second heat treatment is carried out in an oxygen atmosphere.

87. The method as claimed in claim 71, wherein said non-doped silicon glass layer is selectively etched by use of a resist as a mask and by an electron cyclotron resonance plasma etching using $CF_4$ as an etching gas.

88. The method as claimed in claim 71, wherein said non-doped silicon glass layer is selectively etched by use of a resist as a mask and by an electron cyclotron resonance plasma etching using $CHF_3$ as an etching gas.

89. The method as claimed in claim 71, wherein said interconnection layer is also etched by a furthermore reactive ion etching which is carried out by use of an reactive gas including chlorine.

90. The method as claimed in claim 89, wherein oxygen is further added to said reactive gas at about 10%.

91. The method as claimed in claim 89, wherein said furthermore reactive ion etching is an electron cyclotron resonance plasma etching.

92. The method as claimed in claim 71, wherein said non-doped silicon glass layer is deposited by a chemical vapor deposition method at a temperature of not more than 400° C.

93. The method as claimed in claim 71, wherein said third heat treatment is carried out in a nitrogen atmosphere.

94. The method as claimed in claim 71, wherein said capacitor is formed over an insulation film over a semiconductor substrate having a semiconductor integrated circuit.

95. The method as claimed in claim 71, wherein said capacitor is formed on a semiconductor substrate having a semiconductor integrated circuit.

96. A method of forming an interconnection over an inter-layer insulator, comprising the steps of:

forming an interconnection layer entirely over an inter-layer insulator which extends over a capacitor having a dielectric layer;

selectively forming a non-doped silicon glass film on the interconnection layer by chemical vapor deposition using tetraethoxysilane and $O_3$;

selectively etching said interconnection layer by a reactive ion etching with use of the non-doped silicon glass film as a mask to define an interconnection; and removing said non-doped silicon glass film.

* * * * *